US009821999B2

(12) United States Patent
Rudow et al.

(10) Patent No.: US 9,821,999 B2
(45) Date of Patent: Nov. 21, 2017

(54) EXTERNAL GNSS RECEIVER MODULE WITH MOTION SENSOR SUITE FOR CONTEXTUAL INFERENCE OF USER ACTIVITY

(71) Applicant: Trimble Inc., Sunnyvale, CA (US)

(72) Inventors: Richard Rudow, Mesa, AZ (US); Shawn D. Weisenburger, Denver, CO (US); James M. Janky, Los Altos, CA (US)

(73) Assignee: Trimble Inc., Sunnyvale, CA (US)

( * ) Notice: Subject to any disclaimer, the term of this patent is extended or adjusted under 35 U.S.C. 154(b) by 438 days.

(21) Appl. No.: 14/498,520

(22) Filed: Sep. 26, 2014

(65) Prior Publication Data

US 2015/0009067 A1 Jan. 8, 2015

Related U.S. Application Data

(63) Continuation-in-part of application No. 14/134,437, filed on Dec. 19, 2013, which is a
(Continued)

(51) Int. Cl.
*B81B 7/02* (2006.01)
*G01P 13/00* (2006.01)
(Continued)

(52) U.S. Cl.
CPC .............. *B81B 7/02* (2013.01); *G01P 13/00* (2013.01); *G01S 19/41* (2013.01); *G01S 19/43* (2013.01);
(Continued)

(58) Field of Classification Search
CPC ................ B81B 7/02; B81B 2201/02; B81B 2201/0228; B81B 2201/0235;
(Continued)

(56) References Cited

U.S. PATENT DOCUMENTS

| | | |
|---|---|---|
| 5,225,842 A | 7/1993 | Brown et al. |
| 5,345,244 A | 9/1994 | Gildea et al. |

(Continued)

FOREIGN PATENT DOCUMENTS

| | | |
|---|---|---|
| EP | 0508405 | 10/1992 |
| EP | 1729145 A1 | 12/2006 |

(Continued)

OTHER PUBLICATIONS

"Comparison of Photogrammetry Software", http://en.wikipedia.org/wiki/Comparison_of_photogrammetry_software, Jul. 8, 2015, 4 pages.
(Continued)

*Primary Examiner* — Bernarr Gregory
(74) *Attorney, Agent, or Firm* — Kilpatrick Townsend & Stockton LLP

(57) ABSTRACT

A method for contextual inference of user activity is disclosed. In one embodiment, an indication of the motion of a pole mounted sensing device comprising at least one motion sensor and a Global Navigation Satellite System (GNSS) receiver configured to at least generate raw GNSS observables is received from the at least one motion sensor. The indication of the motion of the pole mounted sensing device is correlated with an operation defined in a gesture library regarding GNSS data collect by the GNSS receiver at a time when the indication of the motion is detected. The indication and the GNSS data are stored.

24 Claims, 12 Drawing Sheets

Related U.S. Application Data continuation-in-part of application No. 14/035,884, filed on Sep. 24, 2013, now Pat. No. 9,369,843, which is a continuation-in-part of application No. 13/842,447, filed on Mar. 15, 2013, now Pat. No. 9,429,640.

(60) Provisional application No. 61/746,916, filed on Dec. 28, 2012.

(51) Int. Cl.
    *G01S 19/41* (2010.01)
    *G01S 19/43* (2010.01)
    *G01S 19/00* (2010.01)

(52) U.S. Cl.
    CPC ............. *B81B 2201/0235* (2013.01); *B81B 2201/0242* (2013.01)

(58) Field of Classification Search
CPC . B81B 2201/0242; G01P 13/00; G01S 19/38; G01S 19/39; G01S 19/40; G01S 19/41; G01S 19/42; G01S 19/43; G01S 13/88; G01S 19/01; G01S 19/03; G01S 19/04; G01S 19/44; G01S 19/13; G01S 19/35
See application file for complete search history.

(56) References Cited

U.S. PATENT DOCUMENTS

| | | | |
|---|---|---|---|
| 5,379,224 A | 1/1995 | Brown et al. | |
| 5,471,217 A | 11/1995 | Hatch et al. | |
| 5,477,228 A | 12/1995 | Tiwari et al. | |
| 5,512,905 A * | 4/1996 | Nichols | G01S 19/35 33/366.12 |
| 5,523,761 A | 6/1996 | Gildea | |
| 5,594,454 A | 1/1997 | Devereux et al. | |
| 5,621,416 A | 4/1997 | Lennen | |
| 5,704,583 A * | 1/1998 | Putland | G01S 19/35 248/300 |
| 5,734,348 A * | 3/1998 | Aoki | G01S 19/04 342/352 |
| 5,740,048 A | 4/1998 | Abel et al. | |
| 5,805,108 A | 9/1998 | Lennen | |
| 5,862,501 A | 1/1999 | Talbot et al. | |
| 5,899,957 A | 5/1999 | Loomis | |
| 5,903,235 A | 5/1999 | Nichols | |
| 5,913,170 A | 6/1999 | Wortham | |
| 6,067,046 A | 5/2000 | Nichols | |
| 6,072,431 A | 6/2000 | Froeberg | |
| 6,249,245 B1 | 6/2001 | Watters et al. | |
| 6,324,473 B1 | 11/2001 | Eschenbach | |
| 6,408,178 B1 | 6/2002 | Wickstrom et al. | |
| 6,429,808 B1 | 8/2002 | King et al. | |
| 6,430,503 B1 | 8/2002 | McBurney et al. | |
| 6,473,030 B1 | 10/2002 | McBurney et al. | |
| 6,507,738 B1 | 1/2003 | Allison et al. | |
| 6,510,387 B2 | 1/2003 | Fuchs et al. | |
| 6,564,144 B1 | 5/2003 | Cherverny | |
| 6,590,525 B2 | 7/2003 | Yule et al. | |
| 6,711,293 B1 | 3/2004 | Lowe | |
| 6,853,909 B2 | 2/2005 | Scherzinger | |
| 7,003,112 B1 | 2/2006 | Froeberg | |
| 7,043,364 B2 | 5/2006 | Scherzinger | |
| 7,151,489 B2 | 12/2006 | Pande et al. | |
| 7,191,097 B1 | 3/2007 | Lee et al. | |
| 7,336,814 B2 | 2/2008 | Boca et al. | |
| 7,480,511 B2 | 1/2009 | O'Meagher | |
| 7,541,974 B2 | 6/2009 | Scherzinger | |
| 7,570,204 B1 | 8/2009 | McGraw et al. | |
| 7,908,106 B2 | 3/2011 | Cho et al. | |
| 7,961,141 B2 | 6/2011 | Dai et al. | |
| 8,024,144 B2 | 9/2011 | Kludas et al. | |
| 8,032,152 B2 | 10/2011 | Manson et al. | |
| 8,044,852 B2 | 10/2011 | Green et al. | |
| 8,068,848 B2 | 11/2011 | Manson et al. | |
| 8,068,849 B2 | 11/2011 | Manson et al. | |
| 8,078,192 B2 | 12/2011 | Wirola et al. | |
| 8,081,987 B2 | 12/2011 | Manson et al. | |
| 8,081,988 B2 | 12/2011 | Manson et al. | |
| 8,081,989 B2 | 12/2011 | Manson et al. | |
| 8,085,196 B2 | 12/2011 | Whitehead | |
| 8,085,387 B2 | 12/2011 | Kludas et al. | |
| 8,095,149 B2 | 1/2012 | Manson et al. | |
| 8,134,497 B2 | 3/2012 | Janky et al. | |
| 8,136,545 B2 | 3/2012 | Jablonski | |
| 8,242,956 B2 | 8/2012 | LaMance et al. | |
| 8,339,311 B2 | 12/2012 | Walley et al. | |
| 8,368,875 B2 | 2/2013 | Kludas et al. | |
| 8,447,519 B2 | 5/2013 | Basnayake et al. | |
| 8,699,409 B2 | 4/2014 | Aryan et al. | |
| 8,719,188 B2 | 5/2014 | Kuhn et al. | |
| 9,037,527 B2 | 5/2015 | Kuhn et al. | |
| 9,322,918 B2 * | 4/2016 | Vollath | G01S 19/04 |
| 2001/0017599 A1 | 8/2001 | Yule et al. | |
| 2002/0072854 A1 | 6/2002 | Fuchs et al. | |
| 2002/0186180 A1 | 12/2002 | Duda | |
| 2003/0058164 A1 * | 3/2003 | Zhdanov | G01S 19/44 342/357.32 |
| 2003/0083804 A1 | 5/2003 | Pilley et al. | |
| 2003/0114984 A1 | 6/2003 | Scherzinger | |
| 2005/0064878 A1 | 3/2005 | O'Meagher et al. | |
| 2005/0104774 A1 | 5/2005 | Pande et al. | |
| 2006/0146136 A1 | 7/2006 | Cho et al. | |
| 2007/0139262 A1 | 6/2007 | Scherzinger | |
| 2007/0241961 A1 * | 10/2007 | Ogawa | G01S 19/04 342/357.41 |
| 2007/0268179 A1 * | 11/2007 | Ogawa | G01S 19/04 342/357.41 |
| 2008/0263097 A1 | 10/2008 | Manson et al. | |
| 2008/0319664 A1 | 12/2008 | Kremin et al. | |
| 2009/0024325 A1 | 1/2009 | Scherzinger | |
| 2009/0083430 A1 | 3/2009 | Edge et al. | |
| 2009/0093959 A1 | 4/2009 | Scherzinger et al. | |
| 2009/0189804 A1 | 7/2009 | Ashjaee et al. | |
| 2009/0262016 A1 | 10/2009 | Wirola et al. | |
| 2010/0057359 A1 | 3/2010 | Caballero et al. | |
| 2010/0063733 A1 | 3/2010 | Yunck | |
| 2010/0079333 A1 | 4/2010 | Janky et al. | |
| 2010/0141510 A1 | 6/2010 | Dai et al. | |
| 2010/0231443 A1 | 9/2010 | Whitehead | |
| 2010/0260150 A1 | 10/2010 | Aryan et al. | |
| 2011/0018761 A1 | 1/2011 | Walley et al. | |
| 2011/0064312 A1 | 3/2011 | Janky et al. | |
| 2011/0163914 A1 | 7/2011 | Seymour et al. | |
| 2011/0181509 A1 * | 7/2011 | Rautiainen | G01S 13/88 345/158 |
| 2011/0187590 A1 | 8/2011 | Leandro | |
| 2011/0195687 A1 | 8/2011 | Das et al. | |
| 2011/0267230 A1 | 11/2011 | LaMance et al. | |
| 2011/0285587 A1 | 11/2011 | Vollath et al. | |
| 2012/0116676 A1 | 5/2012 | Basnayake et al. | |
| 2012/0163656 A1 | 6/2012 | Wang et al. | |
| 2012/0166137 A1 | 6/2012 | Grässer et al. | |
| 2012/0330601 A1 | 12/2012 | Soubra et al. | |
| 2013/0027246 A1 | 1/2013 | Hadef et al. | |
| 2013/0243250 A1 | 9/2013 | France et al. | |
| 2014/0081571 A1 | 3/2014 | Briggs et al. | |
| 2014/0184442 A1 | 7/2014 | Large et al. | |
| 2014/0187193 A1 | 7/2014 | Rudow et al. | |
| 2014/0240170 A1 | 8/2014 | Rudow et al. | |
| 2014/0253375 A1 | 9/2014 | Rudow et al. | |
| 2014/0292569 A1 | 10/2014 | Wallace et al. | |
| 2014/0292570 A1 | 10/2014 | Wallace et al. | |
| 2014/0375493 A1 | 12/2014 | Weisenburger et al. | |
| 2014/0378170 A1 | 12/2014 | Rudow et al. | |
| 2014/0378171 A1 | 12/2014 | Rudow et al. | |
| 2015/0009067 A1 | 1/2015 | Rudow et al. | |
| 2015/0043012 A1 | 2/2015 | Rudow et al. | |
| 2015/0045058 A1 | 2/2015 | Rudow et al. | |
| 2015/0045059 A1 | 2/2015 | Rudow et al. | |
| 2015/0050907 A1 | 2/2015 | Rudow et al. | |
| 2015/0057028 A1 | 2/2015 | Rudow et al. | |
| 2015/0289097 A1 | 10/2015 | Rudow et al. | |

(56) References Cited

U.S. PATENT DOCUMENTS

FOREIGN PATENT DOCUMENTS

| EP | 2275778 A1 | 1/2011 | |
|---|---|---|---|
| EP | 2 722 647 A1 | 4/2014 | |
| KR | 20110085744 | 7/2011 | |
| KR | 101241171 B1 * | 3/2013 | ............. G01C 19/38 |
| WO | 2005/045458 | 5/2005 | |
| WO | 2008089792 A1 | 7/2008 | |
| WO | 2009074654 A1 | 6/2009 | |
| WO | 2011120141 A1 | 10/2011 | |

OTHER PUBLICATIONS

"Photogrammetry", http://en.wikipedia.org/wiki/Photogrammetry, Jun. 25, 2015, 5 pages.
"Pi Pelican Imaging: Life in 3D", http://www.pelicanimaging.com, 2015, 3 pages.
"Spirit Level with bubble", https://play.google.com/store/apps/details?id=com.zabaanapps.android.level, Mar. 25, 2014, 2 Pages.
"Technical Tips from Inland GPS", Trimble TSC2—RTK over internet—establishing IP Connection, Jun. 14, 2011, 8 pages.
"Theodolite", Hunter Research & Technology, Mar. 24, 2014, 1 Page.
"Trimble S8 Total Station Datasheet", Trimble Navigation Limited, 2013, 4 Pages.
"Wireless RTK Bridge—Cellular User Guide", Revision 1.4, 2009, 47 pages.
Church, "Close Range Photogrammetry vs. 3D Scanning of Archeological Documentation", http://ncptt.nps.gov/blog/close-range-photogrammetry-vs-3d-scanning-for-archaeological-documentation/, Nov. 6, 2012, 10 pages.
Grussenmeyer, et al., "A comparison of photogrammetry software packages for the documentation of buildings", http://halshs.archives-ouvertes.fr/docs/00/28/12/54/PDF/grussenmeyer_alkhalil_FIG2000.PDF, May 21, 2008, 9 pages.
Hatch, "The Synergism of GPS Code and Carrier Measurements", Proceedings of the Third International Geodetic Symposium on Satellite Doppler Positioning, 1982, 1213-1232.
Ike, "Spike: Laser Accurate Measurement & Modeling on Smartphones", https://www.kickstarter.com/projects/ikegps/spike-laser-accurate-measurement-and-modelling-on?ref=nav_search, Oct. 2, 2013, 14 Pages.
Landau, et al., "Virtual Reference Stations Versus Broadcast Solutions in Network RTK", GNSS 2003, Graz, Austria, Apr. 2003, 15 pages.
Thipparthi, "Imporving Prositional Accuracy Using Carrier Smoothing Techniques in Inexpensive GPS Receivers", MSEE Thesis, New Menixo State University, Las Cruces, NM, Feb. 2004, 101 Pages.
"PCT/US2015/035328 International Search Report", dated Oct. 15, 2015, pp. 1-13.
"PCT/US2015/035346 International Search Report", dated Oct. 13, 2015, pp. 1-12.
Afzal, "Design Methodology for a Dual Frequency Configurable GPS Receiver", Proceedings of the 23rd International Technical Meeting of the Satellite Division of the Institute of Navigation (ION GNSS 2010), Sep. 24, 2010, pp. 2892-2900.
Guixens, et al., "System Aspects and Practical Results for Precise Car Navigation with Modern Civil Signals Using a Software Receiver", Proceedings of the 21st International Technical Meeting of the Satellite Division of the Institute of Navigation (ION GNSS 2008), Sep. 19, 2008, pp. 2280-2292.
Haak, "A Multi-Purpose Software GNSS Receiver for Automotive Applications", Proceedings of the 23rd International Technical Meeting of the Satellite Division of the Institute of Navigation (ION GNSS 2010), Sep. 24, 2010, pp. 1869-1874.
Ruegamer, et al., "A Flexible and Portable Multiband GNSS Front-end System", Proceedings of the 25th International Technical Meeting of the Satellite Division of the Institute of Navigation (ION GNSS 2012), Sep. 21, 2012, pp. 2378-2389.
"PCT/US2013/078125 International Search Report and Written Opinion", dated Apr. 23, 2014, 25 pages.
Afzal, Muhammad H., "Design Methodology for Dual Frequency Configurable GPD Receiver", ION GNSS 2010, Session E5, Portland, OR, Sep. 21-24, 2010, 9 Pages.
Brown, Alison, "TIDGET Mayday System for Motorists", Presented at IEEE Position Location and Navigation Symposium (PLANS) '94 Las Vegas, NV, Apr. 1994, 7 pages.
Rho, Hyunho, "Dual-Frequency GPS Precise Point Positioning with WADGPS Corrections", Department of Geodesy and Geomatics Engineering, University of new Brunswick, Fredericton, N.B. Canada, ION GNSS 18th International Technical Meeting of the Satellite Division, Sep. 13-16, 2005, 1470-1482.
International Search Report of the International Searching Authority for PCT Application No. PCT/US2015/052370 dated Jan. 8, 2016, 6 pages.
International Written Opinion of the International Searching Authority for PCT Application No. PCT/US2015/052370 dated Jan. 8, 2016, 7 pages.

* cited by examiner

800

```
┌─────────────────────────────────────────────────────────────────────┐
│  RECEIVING FROM AT LEAST ONE MOTION SENSOR AN INDICATION OF THE     │
│  MOTION OF A POLE MOUNTED SENSING DEVICE COMPRISING THE AT LEAST    │
│  ONE MOTION SENSOR AND A GLOBAL NAVIGATION SATELLITE SYSTEM         │
│  (GNSS) RECEIVER CONFIGURED TO AT LEAST GENERATE GNSS OBSERVABLES   │
│                                 801                                 │
└─────────────────────────────────────────────────────────────────────┘
                                   │
                                   ▼
┌─────────────────────────────────────────────────────────────────────┐
│   CORRELATING THE INDICATION OF THE MOTION OF THE POLE MOUNTED      │
│   SENSING DEVICE WITH AN OPERATION DEFINED IN A GESTURE LIBRARY     │
│  REGARDING GNSS DATA COLLECTED BY THE GNSS RECEIVER AT A TIME WHEN  │
│             THE INDICATION OF THE MOTION IS DETECTED                │
│                                 802                                 │
└─────────────────────────────────────────────────────────────────────┘
                                   │
                                   ▼
┌─────────────────────────────────────────────────────────────────────┐
│               STORING THE INDICATION AND THE GNSS DATA              │
│                                 803                                 │
└─────────────────────────────────────────────────────────────────────┘
```

```
┌─────────────────────────────────────────────────────────────┐
│ STORING IN A NON-TRANSITORY DATA STORAGE DEVICE A GESTURE LIBRARY │
│ WHEREIN AN INDICATION OF MOTION OF A MOTION SENSOR IS CORRELATED │
│ WITH A DEFINED OPERATION IN THE COLLECTION OF GLOBAL NAVIGATION │
│ SATELLITE SYSTEM (GNSS) DAT BY A GNSS RECEIVER CONFIGURED TO AT │
│           LEAST GENERATE RAW GNSS OBSERVABLES                │
│                          1001                               │
└─────────────────────────────────────────────────────────────┘
                              │
                              ▼
┌─────────────────────────────────────────────────────────────┐
│  RECEIVING AT A PROCESSOR AN INDICATION OF THE MOTION OF AT LEAST │
│                     ONE MOTION SENSOR                        │
│                          1002                               │
└─────────────────────────────────────────────────────────────┘
                              │
                              ▼
┌─────────────────────────────────────────────────────────────┐
│         ACCESSING THE GESTURE LIBRARY BY THE PROCESSOR       │
│                          1003                               │
└─────────────────────────────────────────────────────────────┘
                              │
                              ▼
┌─────────────────────────────────────────────────────────────┐
│  DETERMINING BY THE PROCESSOR THAT THE INDICATION OF THE MOTION IS │
│                DEFINED IS THE GESTURE LIBRARY                │
│                          1004                               │
└─────────────────────────────────────────────────────────────┘
                              │
                              ▼
┌─────────────────────────────────────────────────────────────┐
│    PERFORMING BY THE PROCESSOR THE DEFINED OPERATION IN THE   │
│  COLLECTION OF GNSS DATA IN RESPONSE TO THE DETERMINING BY THE │
│   PROCESSOR THAT THE INDICATION OF THE MOTION IS DEFINED IN THE │
│                       GESTURE LIBRARY                        │
│                          1005                               │
└─────────────────────────────────────────────────────────────┘
```

FIG. 10

EXTERNAL GNSS RECEIVER MODULE WITH MOTION SENSOR SUITE FOR CONTEXTUAL INFERENCE OF USER ACTIVITY

CROSS-REFERENCE TO RELATED APPLICATIONS (CONTINUATION-IN-PART)

This application claims priority and is a continuation-in-part application of U.S. patent application Ser. No. 14/134,437, filed on Dec. 19, 2013 now U.S. Pat. No. 9,612,341, entitled, "GNSS RECEIVER POSITIONING SYSTEM," by Large et al., and assigned to the assignee of the present application.

Application Ser. No. 14/134,437, filed on Dec. 19, 2013, now U.S. Pat. No. 9,612,341, claims priority and is a continuation-in-part application of U.S. patent application Ser. No. 14/035,884, filed on Sep. 24, 2013 now U.S. Pat. No. 9,369,843, entitled, "EXTRACTING PSEUDORANGE INFORMATION USING A CELLULAR DEVICE" by Rudow et al., and assigned to the assignee of the present application and to the extent not repeated herein.

Application Ser. No. 14/134,437 filed on Dec. 19, 2013, now U.S. Pat. No. 9,612,341, also claims priority to and benefit of U.S. Provisional Patent Application No. 61/746,916, filed on Dec. 28, 2012 entitled, "IMPROVED GPS/GNSS ACCURACY FOR A CELL PHONE" by Rudow et al.

Application Ser. No. 14/035,884, filed on Sep. 24, 2013, now U.S. Pat. No. 9,369,843, claims priority to and is a continuation-in-part to patent application Ser. No. 13/842,447, filed on Mar. 15, 2013, now U.S. Pat. No. 9,429,640, entitled "OBTAINING PSEUDORANGE INFORMATION USING A CELLULAR DEVICE," by Rudow et al., and assigned to the assignee of the present application.

BACKGROUND

Most handheld wireless devices, such as cellular telephones, tablet computers, or the like are equipped with Global Navigation Satellite System (GNSS) receivers. However, these receivers, and their antennas, are designed to accommodate a number of variables which result in reduced precision in determining the location of the device. For example, most GNSS chipsets used in handheld wireless devices are designed primarily to reduce power consumption in the device. Power consumption has long been an issue of concern for handheld devices and the wide variety of devices and processes running concurrently on handheld devices makes low power consumption a primary concern. Another priority for handheld wireless devices is for a reduce time to fix. In other words, getting a less accurate position fix quickly is seen as more desirable for users who may be satisfied with a position fix which is reasonable accurate (e.g., within 10 meters of the user's actual location). Finally, as the form factor of handheld wireless devices is trending toward smaller devices, the physical space available for a GNSS antenna dictates the antenna design. As a result, less that optimal antenna designs are adopted for handheld wireless devices. This is further exacerbated by the increased demand for space by additional devices as they are incorporated into next generation handheld wireless devices. However, as discussed above, this has not been seen as a detriment as most users are satisfied with the level of precision in determining the location of the device.

BRIEF DESCRIPTION OF THE DRAWINGS

The accompanying drawings, which are incorporated in and form a part of this application, illustrate embodiments of the subject matter, and together with the description of embodiments, serve to explain the principles of the embodiments of the subject matter. Unless noted, the drawings referred to in this brief description of drawings should be understood as not being drawn to scale. Herein, like items are labeled with like item numbers.

FIG. 8 is a flowchart of a method for contextual inference of user activity in accordance with various embodiments.

FIG. 10 is a flowchart of a method for contextual inference of user activity in accordance with various embodiments.

DESCRIPTION OF EMBODIMENTS

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in the following Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Unless specifically stated otherwise as apparent from the following discussions, it is appreciated that throughout the description of embodiments, discussions utilizing terms such as "storing," "receiving," "generating," "using," "determining," "correlating," "sending," "recognizing," "accessing," and "performing" to transform the state of a computer system, or the like, refer to the actions and processes of a computer system, data storage system, storage system controller, microcontroller, hardware processor, or similar electronic computing device or combination of such electronic computing devices. The computer system or similar electronic computing device manipulates and transforms data represented as physical (electronic) quantities within the computer system's/device's registers and memories into other data similarly represented as physical quantities within the computer system's/device's memories or registers or other such information storage, transmission, or display devices.

Figure 1A:
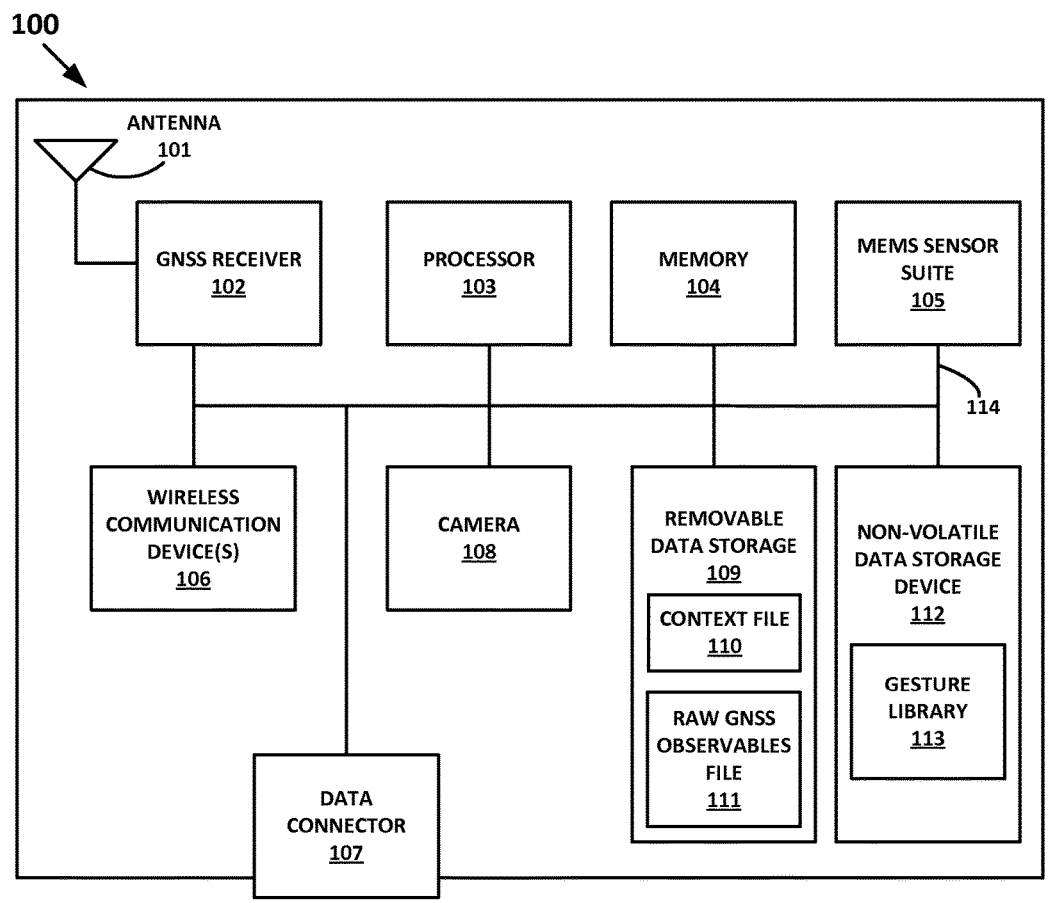
FIG. 1A is a block diagram of an example external GNSS receiver module in accordance with various embodiments.

FIG. 1A shows an example external GNSS receiver module 100 in accordance with various embodiments. As will be explained in greater detail below, external GNSS receiver module 100 is configured to be used as a sensing device to detect the motion of a GNSS receiver/antenna combination and to report and record that motion data for later use. In FIG. 1A, external GNSS receiver module 100 comprises a GNSS antenna 101 coupled with a GNSS receiver 102. GNSS receiver 102 is coupled with a bus 114. In accordance with various embodiments, there are a variety of antenna designs which can be implemented as GNSS antenna 101 in accordance with various embodiments such as, but not limited to, patch antennas, quadrifiler helix antennas, and planar quadrifiler antennas. In typical GNSS antennas currently used in cellular devices, the GNSS antenna is usually configured for linear polarization and not a circularly polarized design. This results in a significant loss of signal from orbiting GNSS satellites, at least 3 dB. However, in one embodiment antenna 101 is implemented as a circularly polarized GNSS antenna to provide better signal reception than would typically be exhibited by a cellular device. It is noted that antenna 101 is not limited to a circularly polarized design and other antenna designs can be implemented as antenna 101. However, antenna 101 is not limited by the space and design constraints typically found in handheld wireless devices and is capable of sensitivity in picking up GNSS satellite signals. It is noted that the term "GNSS" refers to a variety of satellite navigation systems employed worldwide including, but not limited to, the Global Positioning System (GPS), the Global Navigation Satellite System (GLONASS), the GALILEO satellite system, the BeiDou navigation satellite system, the Compass navigation satellite system, the Indian Region Navigation Satellite System (IRNSS), the Quasi-Zenith Satellite System (QZSS) navigation satellite system, or other implementations.

In accordance with various embodiments, GNSS receiver 102 is configured to output at least raw GNSS observables (e.g., the L1 pseudorange, possibly the L2 pseudorange if accessible, and the coherent L1 and L2 carrier phases) of each GNSS in view of external GNSS receiver module 100. As will be explained in greater detail below, the raw GNSS observables are stored in a raw GNSS observables file 111 on external GNSS receiver module 100. In accordance with at least one embodiment, Doppler shift information of the satellite signal frequency of each GNSS satellite in view of external GNSS receiver module 100 is also stored in raw GNSS observables file 111. In accordance with at least one embodiment, GNSS receiver 102 is configured to receive Satellite-Based Augmentation System (SBAS) signals to improve the precision in determining the location of antenna 101. Examples of satellite-based augmentation system (SBAS) are Indian GPS aided Geo Augmented Navigation System (GAGAN), European Geostationary Navigation Overlay Service (EGNOS), Japanese Multi-functional Satellite Augmentation System (MSAS), John Deere's StarFire, WAAS, and Trimble's OmniStar.

Wide Area Augmentation System (WAAS) corrections corrections of satellite position and their behavior. WAAS was developed by the Federal Aviation Administration (FAA). WAAS includes a network of reference stations that are on the ground located in North America and Hawaii. The reference stations transmit their respective measurements to master stations which queue their respective received measurements. The master stations transmit WAAS corrections to geostationary WAAS satellites, which in turn broadcast the WAAS corrections back to earth where external GNSS receiver module 100, which includes a WAAS-enabled GPS receiver, can receive the broadcasted WAAS corrections. According to one embodiment, the GNSS receiver 102 is a WAAS-enabled GPS receiver. The WAAS corrections can be used to improve the accuracy of external GNSS receiver module's positions, for example, by applying the WAAS corrections to extracted pseudoranges. WAAS operation and implementation is well known in the art.

In accordance with at least one embodiment, external GNSS receiver module 100 can receive GNSS corrections (e.g., Real-Time Kinematics (RTK) corrections data from another device (e.g., handheld wireless device 201 of FIG. 1B) to improve the precision in determining the location of antenna 101. In accordance with various embodiments, the improved antenna design realized in antenna 101 as well as a GNSS receiver 102 which is configured for greater precision applications results in improved sensitivity in determining the location of external GNSS receiver module 100. For example, in accordance with one embodiment a precision of approximately 1 meter in determining the location of external GNSS receiver module 100 is realized. In accordance with various embodiments, when Real-Time Kinematics (RTK) corrections are used as discussed below, centimeter-level precision can be realized. In accordance with various embodiments, the navigation processing can be performed by GNSS receiver 102, processor 103, performed by a handheld wireless device (e.g., 201 of FIG. 1B), or by a computer system (not shown) during post-processing of the collected GNSS data.

External GNSS receiver module 100 of FIG. 1A also includes a processor 103 coupled to bus 114 for processing information and instructions. In at least one embodiment, external GNSS receiver module 100 is also well suited to a multi-processor environment in which a plurality of processors (not shown) are present. Conversely, external GNSS receiver module 100 is also well suited to having a single processor such as, for example, processor 103. Processors 103 may be any of various types of microprocessors. External GNSS receiver module 100 also includes data storage features such as a computer usable volatile memory 104, e.g., random access memory (RAM), coupled to bus 114 for storing information and instructions for processor 103. External GNSS receiver module 100 also includes computer usable non-volatile data storage device 112, e.g., read only memory (ROM), coupled to bus 114 for storing static information and instructions for processor. It is noted that in the embodiment shown in FIG. 1A that gesture library 113 is stored in non-volatile data storage device 112 of external GNSS receiver module 100. However, in at least one embodiment, gesture library 113 is stored in a handheld wireless device which is separate from external GNSS receiver module (e.g., handheld wireless device 201 of FIGS. 1B, 2A, and 2B). In accordance with various embodiments, gesture library 113 can be stored in a cloud computing environment. In accordance with at least one embodiment, gesture library 113 can be downloaded from the cloud onto external GNSS receiver module 100 or handheld wireless device 201 (e.g., onto memory 104 or memory 144 respectively). In accordance with another embodiment, gesture library 113 can be accessed by a computer system (not shown) during post-processing of collected GNSS data.

External GNSS receiver module 100 further comprises a micro-electro-mechanical system (MEMS) sensor suite 105. In accordance with various embodiments, MEMS sensor suite comprises at least one of: a 3-axis gyroscope, a 3-axis accelerometer, and a 3-axis magnetometer. In various embodiments, MEMS sensor suite 105 comprises a 3-axis gyroscope, a 3-axis accelerometer, and a 3-axis magnetometer. It is noted that MEMS sensor suite 105 can include other sensors including, but not limited to, temperature sensors, barometric pressure sensors, physical pressure sensors, etc. An example of a MEMS sensor suite in accordance with various embodiments is the InvenSense 9150 chipset which includes a processor capable of processing motion fusion algorithms. In accordance with various embodiments, MEMS sensor suite 105 is configured to send indications of the motion and orientation of external GNSS receiver module 100 to processor 103. In accordance with various embodiments, the separate MEMS sensor suite 105 is provided in external GNSS receiver module 100 to provide inertial sensor data in cases when external GNSS receiver module 100 is physically separate from a handheld wireless device (e.g., handheld wireless device 201). In accordance with various embodiments, external GNSS receiver module 100 can be coupled with handheld wireless device 201 proximate to external GNSS receiver module 100 and provide the benefits of antenna 101 and GNSS receiver 102 to improve the precision in determining the location of antenna 101, and thus handheld wireless device 201. In this instance, external GNSS receiver module 100 can communicate with a proximate handheld wireless device 201 via data connector 107 or wireless communication device(s) 106. As an example, the data stored in context file 110 and/or raw GNSS observables file 111 can be sent to handheld wireless device 201 via data connector 107. In accordance with at least one embodiment, GNSS receiver 102 is continuously receiving raw GNSS observables which are stored in raw GNSS observables file 111. Each time an intentional user gesture is detected, it is timestamped (e.g., using clock data from GNSS receiver 120) and stored in context file 110. Thus, the user gesture is noted to indicate that a user desires a particular operation to be performed with the GNSS raw observables data collected at the time the user gesture was detected. In accordance with various embodiments, an intentional user gesture is defined as specific motions, or combinations of motions, detected by MEMS sensor suite 105, which are within pre-defined motion parameters. In accordance with another embodiment, while raw GNSS observables are received continuously, they are not stored in raw GNSS observables file 111 until it has been determined that an intentional user gesture has been performed. Furthermore, while various embodiments described herein disclose separate data files for context file 110 and raw GNSS observables file 111, in at least one embodiment the data comprising context file 110 and raw GNSS observables file 111 can be stored in the same data file. Additionally, when context file 110 and raw GNSS observables file 111 are separate entities, they can be stored in the same device, separate devices, and separate locations in accordance with various embodiments. Additionally, context file 110 and/or raw GNSS observables file 111 can be uploaded into a cloud based computing environments in accordance with various embodiments.

Alternatively, external GNSS receiver module 100 can be separate from handheld wireless device 201 and communicate via wireless communication device(s) 106. Thus, external GNSS receiver module 100 can be pole mounted, roof-top mounted, or the like and exchange data with handheld wireless device 201. In accordance with at least one embodiment, MEMS sensor suite 105 is configured to perform a sensor fusion operation and to output data indicating the motion state of external GNSS receiver module 100. Sensor fusion refers to an operation of combining data from various disparate sources to obtain a more complete understanding of the state of a situation, device, or the like. In the embodiment of MEMS sensor suite 105, a 9-axis motion suite allows determining the motion state and orientation of external GNSS receiver module 100. In another embodiment, MEMS sensor suite 105 does not perform sensor fusion operations and the motion information from MEMS sensor suite 105 is separately accessed by, for example, processor 103, or a processor located apart from external GNSS receiver module 100. In at least one embodiment, the sensor fusion operation is performed by a processor located apart from external GNSS receiver module 100 (e.g., by processor 143 of handheld wireless device 201).

In accordance with various embodiments, at least one wireless communication component (e.g., 106 of FIG. 1A) is coupled with bus 114. It is noted that a plurality of wireless communication components (not shown) can be disposed within external GNSS receiver module 100 in accordance with various embodiments. Examples of wireless communication components 106 which can be used in accordance with various embodiments include, but are not limited to, cellular transceivers, wireless networking transceivers, radio transceivers, etc. Examples of cellular networks used by wireless communication component 106 include, but are not limited to GSM cellular networks, GPRS cellular networks, CDMA cellular networks, EDGE cellular networks, Time Division Synchronous Code Division Multiple Access (TD-SCDMA) cellular networks, Long-Term Evolution (LTE) compliant cellular networks, 3G, 4G, and 5G compliant cellular networks, etc. In accordance with at least one embodiment, wireless communication component 106 is configured to operate on a satellite-based cellular network such as the Inmarsat or Iridium communication networks. Other examples of wireless communication components 106 used in accordance with various embodiments include, but are not limited to, Wi-Fi, WiMAX, implementations of the IEEE 802.11 specification, implementations of the IEEE 802.15.4 specification for personal area networks, and a short range wireless connection operating in the Instrument Scientific and Medical (ISM) band of the radio frequency spectrum in the 1400-1484 MHz range (e.g., implementations of the Bluetooth® standard) including Bluetooth Low Energy (BLE) implementations, implementations of the IEEE 1902.1 (RuBee) specification, implementations of IEEE 802.15 (ZigBee) standard, etc.

External GNSS receiver module 100 also includes a data connector 107 for coupling external GNSS receiver module 100 with external entities. For example, in one embodiment data connector 107 is a serial data port, or a parallel data port, for enabling wired communications between external GNSS receiver module 100 and an external device such as, but not limited to, handheld wireless device 201. More specifically, in various embodiments, data connector 107 can be used to couple external GNSS receiver module 100 with handheld wireless device 201 for the exchange of data comprising context file 110 as well as raw GNSS observables comprising raw GNSS observables file 111. It is noted that rather than sending the contents of context file 110 and/or raw GNSS observables file 111 to handheld wireless device 201, the data can be sent directly from external GNSS receiver module 100 to handheld wireless device 201. In accordance with at least one embodiment, the data stored in context file 110 and/or raw GNSS observable file 111 can be uploaded into a cloud computing environment for further processing and storage. Thus, while the indication of motion is stored in context file 110 of external GNSS receiver module 100, it can also be sent to handheld wireless device 201 in at least one embodiment. Similarly, while the raw GNSS observables are stored in raw GNSS observables file 111, the raw GNSS observables, or processed GNSS data, can also be sent to handheld wireless device 201 as well in accordance with various embodiments.

In FIG. 1A, external GNSS receiver module 100 further comprises a camera 108. Examples of camera 108 include a camera, a video camera, a digital camera, a digital video camera, a digital camcorder, etc. In at least one embodiment, camera 108 can include, but is not limited to, image intensifiers, charge coupled devices (CCD) including intensified CCD (ICCD) devices, complimentary metal-oxide semiconductor (CMOS) devices including intensified CMOS (IC-MOS) devices, hybrid photodiode devices, thermal imagers, and near-infrared illumination devices. In accordance with at least one embodiment, camera 108 is configured to detect motion, or the lack thereof, and provide an indication of the motion of external GNSS receiver module 100, or lack thereof, to processor 103. For example, camera 108 is well suited for detecting linear and/or angular motion of external GNSS receiver module 100. In another embodiment, camera 108 can indicate a lack of motion which can be determined as an intentional user gesture. Additionally, camera 108 can be used to provide motion data in the process of calibrating the accelerometers of MEMS sensor suite 105. Furthermore, camera 108 can be used to provide one or more pictures to accompany each measurement to provide a visual context for post processing.

External GNSS receiver module 100 further comprises a removable data storage device 109. Examples of removable data storage device 109 in accordance with various embodiments include, but are not limited to, implementations of the CompactFlash format of data storage devices, implementations of the SmartMedia format of data storage devices, implementations of the SecureDigital format of data storage devices, and implementations of Universal Serial Bus (USB) format of data storage devices. In the example of FIG. 1A, a context file 110 and a raw GNSS observables file 111 are stored on removable data storage device 109. In accordance with various embodiments, context file 110 is used to store indications of the motion of external GNSS receiver module 100 as detected by one or more sensors of MEMS sensor suite 105. As will be explained in greater detail below, these indications of motion are matched or correlated with specific operations to be performed with the collection of GNSS data by GNSS receiver 102 when the motion is detected. In accordance with at least one embodiment, this correlation of the indication of the motion of external GNSS receiver module 100 is performed using gesture library 113.

In accordance with various embodiment, gesture library correlates motion(s) detected by MEMS sensor suite 105 with a specific operation to be performed with GNSS data collected by GNSS receiver at the time a motion is detected by MEMS sensor suite 105. As an example, an indication of angular momentum (e.g., twisting) of external GNSS receiver module 100 in a clockwise direction (e.g., a positive angular momentum around the Z-axis) may be correlated in gesture library 113 as an indication to begin collecting GNSS data and storing that data in raw GNSS observables file 111. Similarly, an indication of angular momentum (e.g., twisting) of external GNSS receiver module 100 in a counter-clockwise direction (e.g., a negative angular momentum around the Z-axis) may be correlated in gesture library 113 as an indication to cease collecting GNSS data and storing that data in raw GNSS observables file 111. As will be described in greater detail below, a variety of gestures, or combinations of gestures, can be correlated to various operations. In accordance with various embodiments, at least one indication of the motion of external GNSS receiver module 100 is correlated with a specific operation to be performed with the collection of GNSS data. However, in accordance with various embodiments a series of indications of motion can be correlated with a specific operation. Furthermore, a separate GNSS data collection operation can be performed independently while one or more other GNSS data collection operations are concurrently being performed. As an example, a discreet position fix of the position of external GNSS receiver module 100 can be collected as a separate event while external GNSS receiver module 100 is collecting GNSS position fixes along a linear feature. Embodiments of external GNSS receiver module 100 are advantageous in that GNSS data collecting operations can be initiated/controlled simply by changing the motion state of external GNSS receiver module 100. Currently, GNSS data collection operations are typically controlled by a user manually interacting with the data collecting device, either using push-buttons, or an interactive display such as a touch panel. However, in some instances this is cumbersome, especially in rough terrain or when a user is wearing gloves. In these instances, the process for the user to interact with the device interface greatly increases the time it takes to collect the desired data. However, using embodiments of external GNSS receiver module 100, a user can collect the desired data more rapidly by simply indicating which operation is to be performed by initiating some physical motion of external GNSS receiver module 100 which is correlated in gesture library 113 with the operation to be performed.

Concurrent with the detection of motion of external GNSS receiver module 100, an indication of the motion is stored in context file 110. In accordance with various embodiments, the indication of motion is time stamped (e.g., using time data received from GNSS receiver 102). Additionally, when the motion is detected, the raw GNSS observables (e.g., the L1 pseudorange, possibly the L2 pseudorange if accessible, the coherent L1 and L2 carrier phases, and Doppler shift information) collected at the moment the motion is detected are stored in raw GNSS observables file 111. These raw GNSS observables are also time stamped so that they can be correlated with the respective indications of motion which are stored in context file 110. Thus, the context file 110 is used to provide an indication of what a user is doing. When data collection is completed, removable data storage device 109 can be removed from external GNSS receiver module 100 and post-processing of the data in context file 110 and raw GNSS observables file 111 can be performed. Using gesture library 113, the motion of external GNSS receiver module 100 can be correlated with an operation to be performed on the collected GNSS data, such as the raw GNSS observables data stored in raw GNSS observables file 111. It is noted that the operation of using gesture library 113 can be performed using external GNSS receiver module 100, handheld wireless device 201, or a computer system (not shown) located apart from either of external GNSS receiver module 100 or handheld wireless device 201.

Figure 1B:
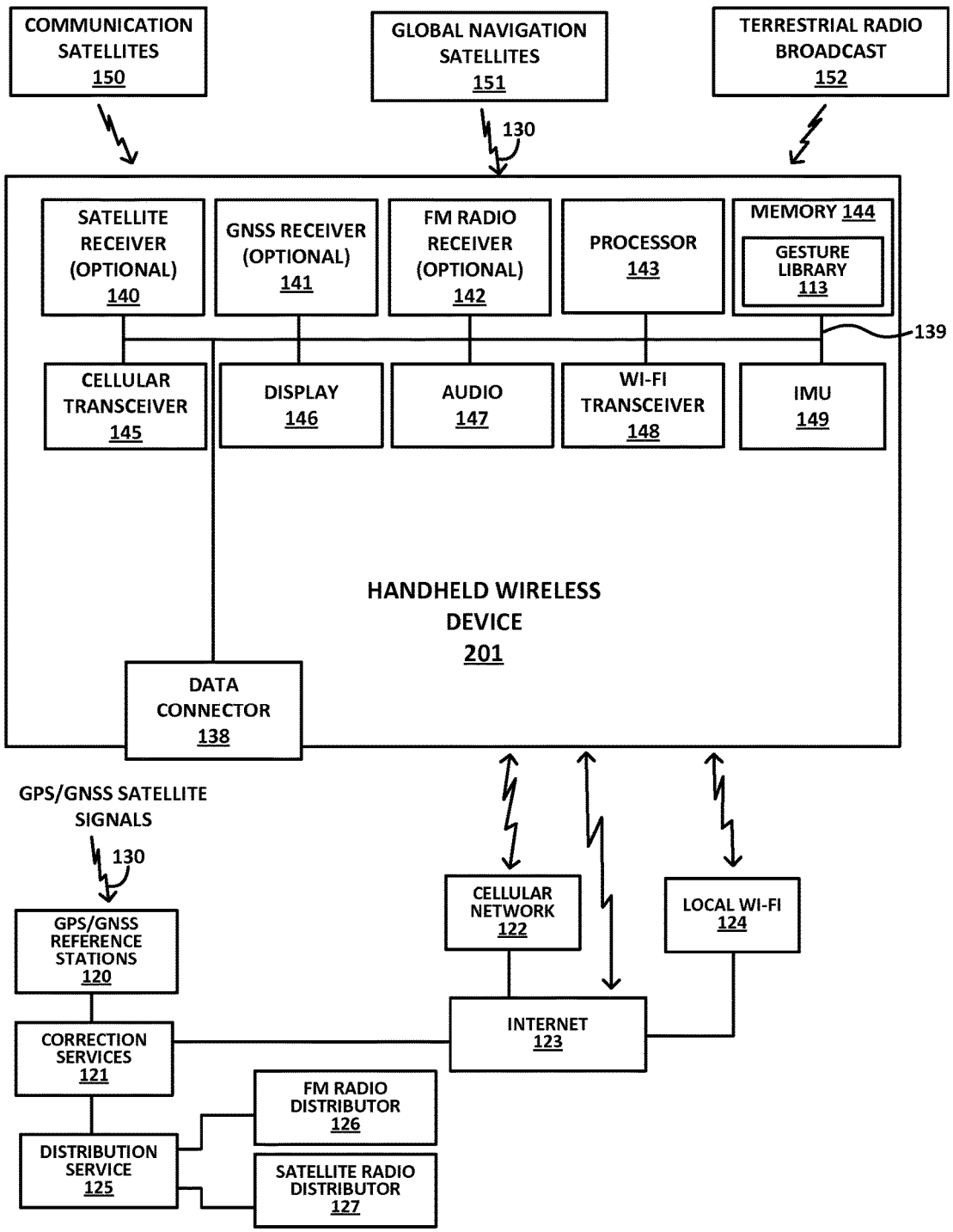
FIG. 1B is a block diagram of an example handheld wireless device in accordance with various embodiments.

FIG. 1B depicts a block diagram of an example handheld wireless device 201, according to one embodiment.

Examples of a handheld wireless device 201 include, but are not limited to, a cell phone, a non-voice enabled cellular device, and a mobile hand-held GNSS receiver. The cellular device may be mobile or stationary.

The handheld wireless device 201 includes a bus 139, an optional satellite receiver 140, an optional GNSS receiver 141, an optional FM radio receiver 142, a processor 143, memory 144, a cellular transceiver 145, a display 146, audio 147, Wi-Fi transceiver 148, IMU 149, and data connector 138. Components 138, 140, 141, 142, 143, 144, 145, 146, 147, 148, and 149, are all connected with the bus 139.

In FIG. 1B, a plurality of broadcast sources is used to convey data and media to a handheld wireless device 201. As an example, handheld wireless device 201 can receive broadcast signals from communication satellites 150 (e.g., two-way radio, satellite-based cellular such as the Inmarsat or Iridium communication networks, etc.), global navigation satellites 151 (e.g., GPS/GNSS satellite signals 130) which provide radio navigation signals (e.g., the GPS, GNSS, GLONASS, GALILEO, BeiDou, Compass, etc.), and terrestrial radio broadcast 253 (e.g., FM radio, AM radio, shortwave radio, etc.)

A handheld wireless device 201 can be configured with a satellite radio receiver 140 coupled with a communication bus 139 for receiving signals from communication satellites 150, a GNSS receiver 141 coupled with bus 139 for receiving radio navigation signals (e.g., 130) from global navigation satellites 151 and for deriving a position of handheld wireless device 201 based thereon. Handheld wireless device 201 further comprises an FM radio receiver 142 coupled with bus 139 for receiving broadcast signals from terrestrial radio broadcast 152. Other components of handheld wireless device 201 comprise a processor 143 coupled with bus 139 for processing information and instructions, a memory 144 coupled with bus 139 for storing information and instructions for processor 143. It is noted that memory 144 can comprise volatile memory and non-volatile memory, as well as removable data storage media in accordance with various embodiments. It is further noted that in the embodiment shown in FIG. 1B, memory 144 comprises gesture library 113. In accordance with various embodiments, handheld wireless device 201 is communicatively coupled with external GNSS receiver module 100 either via a wired or wireless communication link.

Handheld wireless device 201 further comprises a cellular transceiver 145 coupled with bus 139 for communicating via cellular network 122. Examples of cellular networks used by handheld wireless device 201 include, but are not limited to GSM: cellular networks, GPRS cellular networks, CDMA cellular networks, and EDGE cellular networks. Handheld wireless device 201 further comprises a display 146 coupled with bus 139. Examples of devices which can be used as display 146 include, but are not limited to, liquid crystal displays, LED-based displays, and the like. It is noted that display 146 can be configured as a touch screen device (e.g., a capacitive touch screen display) for receiving inputs from a user as well as displaying data. Handheld wireless device 201 further comprises an audio output 147 coupled with bus 139 for conveying audio information to a user. Handheld wireless device 201 further comprises a Wi-Fi transceiver 148 and an inertial measurement unit (IMU) 149 coupled with bus 139. Wi-Fi transceiver 148 may be configured to operate on/in compliance with any suitable wireless communication protocol including, but not limited to: Wi-Fi, WiMAX, implementations of the IEEE 802.11 specification, implementations of the IEEE 802.15.4 specification for personal area networks, and a short range wireless connection operating in the Instrument Scientific and Medical (ISM) band of the radio frequency spectrum in the 1400-1484 MHz range (e.g., implementations of the Bluetooth® standard). Handheld wireless device 201 also includes a data connector 138 for coupling handheld wireless device 201 external entities. For example, in one embodiment data connector 138 is a serial data port, or a parallel data port, for enabling wired communications between handheld wireless device 201 and an external device such as, but not limited to, external GNSS receiver module 100. As an example, the data stored in context file 110 and/or raw GNSS observables file 111 can be sent to handheld wireless device 201 via data connector 138.

Improvements in GNSS/GPS positioning may be obtained by using reference stations with a fixed receiver system to calculate corrections to the measured pseudoranges in a given geographical region. Since the reference station is located in a fixed environment and its location can be determined very precisely via ordinary survey methods, a processor associated with the Reference Station GNSS/GPS receivers can determine more precisely what the true pseudoranges should be to each satellite in view, based on geometrical considerations. Knowing the orbital positions via the GPS almanac as a function of time enables this process, first proposed in 1983, and widely adopted ever since. The difference between the observed pseudorange and the calculated pseudorange for a given Reference station is called the pseudorange correction. A set of corrections for all the global navigation satellites 151 in view is created second by second, and stored, and made available as a service, utilizing GPS/GNSS reference stations 120 and correction services 121. The pseudoranges at both the handheld wireless device 201 GPS receiver 141 and those at the reference stations 120 are time-tagged, so the corrections for each and every pseudorange measurement can be matched to the local cell phone pseudoranges. The overall service is often referred to as Differential GPS, or DGPS. Without any corrections, GNSS/GPS receivers produce position fixes with absolute errors in position on the order of 4.5 to 5.5 m per the GPS SPS Performance Standard, $4^{th}$ Ed. 2008. In FIG. 1B, one or more correction services 121 convey these corrections via a cellular network 122, or the Internet 123. Internet 123 is in turn coupled with a local Wi-Fi network 124 which can convey the corrections to handheld wireless device 201 via Wi-Fi transceiver 148. Alternatively, cellular network 122 can convey the corrections to handheld wireless device 201 via cellular transceiver 145. In some embodiments, correction services 121 are also coupled with a distribution service 125 which conveys the corrections to an FM radio distributor 126. FM radio distributor 126 can broadcast corrections as a terrestrial radio broadcast 103. It should be appreciated that an FM signal is being described as a subset of possible terrestrial radio broadcasts which may be in a variety of bands and modulated in a variety of manners. In some embodiments, handheld wireless device 201 includes one or more integral terrestrial radio antennas associated with integrated terrestrial receivers; FM radio receiver 142 is one example of such a terrestrial receiver which would employ an integrated antenna designed to operate in the correct frequency band for receiving a terrestrial radio broadcast 103. In this manner, in some embodiments, handheld wireless device 201 can receive the corrections via FM radio receiver 142 (or other applicable type of integrated terrestrial radio receiver). In some embodiments, correction services 121 are also coupled with a distribution service 125 which conveys the corrections to a satellite radio distributor 127. Satellite radio distributor 127 can broadcast corrections as a broadcast from one or more communications satellites 201. In some embodiments, handheld wireless device 201 includes one or more integral satellite radio antennas associated with integrated satellite radio receivers 140. Satellite radio receiver 140 is one example of such a satellite receiver which would employ an integrated antenna designed to operate in the correct frequency band for receiving a corrections or other information broadcast from communication satellites 150. In this manner, in some embodiments, handheld wireless device 201 can receive the corrections via satellite radio receiver 140.

Examples of a correction source that provides pseudorange corrections are at least correction service 121, FM radio distribution 126, or satellite radio distributor 127, or a combination thereof. According to one embodiment, a correction source is located outside of the handheld wireless device 201.

The blocks that represent features in FIGS. 1A-1B can be arranged differently than as illustrated, and can implement additional or fewer features than what are described herein. Further, the features represented by the blocks in FIGS. 1A-1B can be combined in various ways. A handheld wireless device 201 can be implemented using software, hardware, hardware and software, hardware and firmware, or a combination thereof.

Real-Time Kinematic System

An improvement to DGPS methods is referred to as Real-time Kinematic (RTK). As in the DGPS method, the RTK method, utilizes a reference station located at determined or surveyed point. The reference station collects data from the same set of satellites in view by the handheld wireless device 201 in the area. Measurements of GPS signal errors taken at the reference station (e.g., dual-frequency code and carrier phase signal errors) and broadcast to handheld wireless device 201 working in the area. The handheld wireless device 201 combines the reference station data with locally collected position measurements to estimate local carrier-phase ambiguities, thus allowing a more precise determination of the position of handheld wireless device 201. The RTK method is different from DGPS methods in that the vector from a reference station to a handheld wireless device 201 is determined (e.g., using the double differences method). In DGPS methods, reference stations are used to calculate the changes needed in each pseudorange for a given satellite in view of the reference station, and the handheld wireless device 201, to correct for the various error contributions. Thus, DGPS systems broadcast pseudorange correction numbers second-by-second for each satellite in view, or store the data for later retrieval as described above.

RTK allows surveyors to determine a true surveyed data point in real time, while taking the data. However, the range of useful corrections with a single reference station is typically limited to about 70 km because the variable in propagation delay (increase in apparent path length from satellite to a receiver of the handheld wireless device 201, or pseudo range) changes significantly for separation distances beyond 70 km. This is because the ionosphere is typically not homogeneous in its density of electrons, and because the electron density may change based on, for example, the sun's position and therefore time of day.

Network RTK

Network RTK typically uses three or more GPS reference stations to collect GPS data and extract information about the atmospheric and satellite ephemeris errors affecting signals within the network coverage region. Data from all the various reference stations is transmitted to a central processing facility, or control center for Network RTK. Suitable software at the control center processes the reference station data to infer how atmospheric and/or satellite ephemeris errors vary over the region covered by the network.

The control center computer processor then applies a process which interpolates the atmospheric and/or satellite ephemeris errors at any given point within the network coverage area and generates a pseudo range correction comprising the actual pseudo ranges that can be used to create a virtual reference station. The control center then performs a series of calculations and creates a set of correction models that provide the handheld wireless device 201 with the means to estimate the ionospheric path delay from each satellite in view from the handheld wireless device 201 and to take account other error contributions for those same satellites at the current instant in time for the location of handheld wireless device 201.

The handheld wireless device 201 is configured to couple a data-capable cellular telephone to its internal signal processing system. The user operating the handheld wireless device 201 determines that he needs to activate the VRS process and initiates a call to the control center to make a connection with the processing computer.

The handheld wireless device 201 sends its approximate position, based on raw GPS data from the satellites in view without any corrections, to the control center. Typically, this approximate position is accurate to approximately 4-7 meters. The user then requests a set of "modeled observables" for the specific location of the handheld wireless device 201. The control center performs a series of calculations and creates a set of correction models that provide the handheld wireless device 201 with the means to estimate the ionospheric path delay from each satellite in view from the handheld wireless device 201, and to take into account other error contributions for those same satellites at the current instant in time for the handheld wireless device 201's location. In other words, the corrections for a specific handheld wireless device 201 at a specific location are determined on command by the central processor at the control center and a corrected data stream is sent from the control center to the handheld wireless device 201. Alternatively, the control center may instead send atmospheric and ephemeris corrections to the handheld wireless device 201 which then uses that information to determine its position more precisely.

These corrections are now sufficiently precise that the high performance position accuracy standard of 2-3 cm may be determined, in real time, for any arbitrary handheld wireless device 201's position. Thus a GPS enabled handheld wireless device 201's raw GPS data fix can be corrected to a degree that makes it behave as if it were a surveyed reference location; hence the terminology "virtual reference station."

An example of a network RTK system in accordance with embodiments of the present invention is described in U.S. Pat. No. 5,899,957, entitled "Carrier Phase Differential GPS Corrections Network," by Peter Loomis, assigned to the assignee of the present application.

The Virtual Reference Station method extends the allowable distance from any reference station to the handheld wireless devices 201. Reference stations may now be located hundreds of miles apart, and corrections can be generated for any point within an area surrounded by reference stations. However, there are many construction projects where cellular coverage is not available over the entire physical area under construction and survey.

Virtual Reference Stations

To achieve very accurate positioning (to several centimeters or less) of a terrestrial mobile platform of a handheld wireless device 201, relative or differential positioning methods are commonly employed. These methods use a GNSS reference receiver located at a known position, in addition to the data from a GNSS receiver 141 on the mobile platform, to compute the estimated position of the mobile platform relative to the reference receiver.

The most accurate known method uses relative GNSS carrier phase interferometry between the GNSS handheld wireless device 201's receiver and GNSS reference receiver antennas plus resolution of integer wavelength ambiguities in the differential phases to achieve centimeter-level positioning accuracies. These differential GNSS methods are predicated on the near exact correlation of several common errors in the handheld wireless device 201 and reference observables. They include ionosphere and troposphere signal delay errors, satellite orbit and clock errors, and receiver clock errors.

When the baseline length between the mobile platform and the reference receiver does not exceed 10 kilometers, which is normally considered a short baseline condition, the ionosphere and troposphere signal delay errors in the observables from the handheld wireless device 201 and reference receivers are almost exactly the same. These atmospheric delay errors therefore cancel in the handheld wireless device 201's reference differential GNSS observables, and the carrier phase ambiguity resolution process required for achieving centimeter-level relative positioning accuracy is not perturbed by them. If the baseline length increases beyond 10 kilometers (considered a long baseline condition), these errors at the handheld wireless device 201 and reference receiver antennas become increasingly different, so that their presence in the handheld wireless device 201's-reference differential GNSS observables and their influence on the ambiguity resolution process increases. Ambiguity resolution on single handheld wireless device 201's reference receiver baselines beyond 10 kilometers becomes increasingly unreliable. This attribute limits the precise resolution of a mobile platform with respect to a single reference receiver, and essentially makes it unusable on a mobile mapping platform that covers large distances as part of its mission, such as an aircraft.

A network GNSS method computes the estimated position of a handheld wireless device 201's receiver using reference observables from three or more reference receivers that approximately surround the handheld wireless device 201's receiver trajectory. This implies that the handheld wireless device 201's receiver trajectory is mostly contained by a closed polygon whose vertices are the reference receiver antennas. The handheld wireless device 201's GNSS receiver 141 can move a few kilometers outside this polygon without significant loss of positioning accuracy. A network GNSS algorithm calibrates the ionosphere and troposphere signal delays at each reference receiver position and then interpolates and possibly extrapolates these to the handheld wireless device 201's position to achieve better signal delay cancellation on long baselines than could be had with a single reference receiver. Various methods of signal processing can be used, however they all yield essentially the same performance improvement on long baselines.

Kinematic ambiguity resolution (KAR) satellite navigation is a technique used in numerous applications requiring high position accuracy. KAR is based on the use of carrier phase measurements of satellite positioning system signals, where a single reference station provides the real-time corrections with high accuracy. KAR combines the L1 and L2 carrier phases from the handheld wireless device 201 and reference receivers so as to establish a relative phase interferometry position of the handheld wireless device 201's antenna with respect to the reference antenna. A coherent L1 or L2 carrier phase observable can be represented as a precise pseudorange scaled by the carrier wavelength and biased by an integer number of unknown cycles known as cycle ambiguities. Differential combinations of carrier phases from the handheld wireless device 201 and reference receivers result in the cancellation of all common mode range errors except the integer ambiguities. An ambiguity resolution algorithm uses redundant carrier phase observables from the handheld wireless device 201 and reference receivers, and the known reference antenna position, to estimate and thereby resolve these ambiguities.

Once the integer cycle ambiguities are known, the handheld wireless device 201's receiver GNSS can compute its antenna position with accuracies generally on the order of a few centimeters, provided that the handheld wireless device 201 and reference antennas are not separated by more than 10 kilometers. This method of precise positioning performed in real-time is commonly referred to as real-time kinematic (RTK) positioning. The separation between a handheld wireless device 201 and reference antennas shall be referred to as "handheld wireless device reference separation."

The reason for the handheld wireless device reference separation constraint is that KAR positioning relies on near exact correlation of atmospheric signal delay errors between the handheld wireless device 201 and reference receiver observables, so that they cancel in the handheld wireless device 201's reference observables combinations (for example, differences between handheld wireless device 201 and reference observables per satellite). The largest error in carrier-phase positioning solutions is introduced by the ionosphere, a layer of charged gases surrounding the earth. When the signals radiated from the satellites penetrate the ionosphere on their way to the ground-based receivers, they experience delays in their signal travel times and shifts in their carrier phases. A second significant source of error is the troposphere delay. When the signals radiated from the satellites penetrate the troposphere on their way to the ground-based receivers, they experience delays in their signal travel times that are dependent on the temperature, pressure and humidity of the atmosphere along the signal paths. Fast and reliable positioning requires good models of the spatio-temporal correlations of the ionosphere and troposphere to correct for these non-geometric influences.

When the handheld wireless device 201 reference separation exceeds 10 kilometers, as maybe the case when the handheld wireless device 201 has a GNSS receiver 141 that is a LEO satellite receiver, the atmospheric delay errors become de-correlated and do not cancel exactly. The residual errors can now interfere with the ambiguity resolution process and thereby make correct ambiguity resolution and precise positioning less reliable.

The handheld wireless device 201's reference separation constraint has made KAR positioning with a single reference receiver unsuitable for certain mobile positioning applications where the mission of the mobile platform of the handheld wireless device 201 will typically exceed this constraint. One solution is to set up multiple reference receivers along the mobile platform's path so that at least one reference receiver falls within a 10 km radius of the mobile platform's estimated position.

Network GNSS methods using multiple reference stations of known location allow correction terms to be extracted from the signal measurements. Those corrections can be interpolated to all locations within the network. Network KAR is a technique that can achieve centimeter-level positioning accuracy on large project areas using a network of reference GNSS receivers. This technique operated in real-time is commonly referred to as network RTK. The network KAR algorithm combines the pseudorange and carrier phase observables from the reference receivers as well as their known positions to compute calibrated spatial and temporal models of the ionosphere and troposphere signal delays over the project area. These calibrated models provide corrections to the observables from the handheld wireless device 201's receiver, so that the handheld wireless device 201's GNSS receiver 141 can perform reliable ambiguity resolution on combinations of carrier phase observables from the handheld wireless device 201 and some or all reference receivers. The number of reference receivers required to instrument a large project area is significantly less than what would be required to compute reliable single baseline KAR solutions at any point in the project area. See, for example, U.S. Pat. No. 5,477,458, "Network for Carrier Phase Differential GPS Corrections," and U.S. Pat. No. 5,899,957, "Carrier Phase Differential GPS Corrections Network". See also Liwen Dai et al., "Comparison of Interpolation Algorithms in Network-Based GPS Techniques," Journal of the Institute of Navigation, Vol. 50, No. 4 (Winter 1003-1004) for a comparison of different network GNSS implementations and comparisons of their respective performances.

A virtual reference station (VRS) network method is a particular implementation of a network GNSS method that is characterized by the method by which it computes corrective data for the purpose of handheld wireless device 201's position accuracy improvement. A VRS network method comprises a VRS corrections generator and a single-baseline differential GNSS position generator such as a GNSS receiver 141 with differential GNSS capability. The VRS corrections generator has as input data the pseudorange and carrier phase observables on two or more frequencies from N reference receivers, each tracking signals from M GNSS satellites. The VRS corrections generator outputs a single set of M pseudorange and carrier phase observables that appear to originate from a virtual reference receiver at a specified position (hereafter called the VRS position) within the boundaries of the network defined by a polygon (or projected polygon) having all or some of the N reference receivers as vertices. The dominant observables errors comprising a receiver clock error, satellite clock errors, ionosphere and troposphere signal delay errors and noise all appear to be consistent with the VRS position. The single-baseline differential GNSS position generator implements a single-baseline differential GNSS position algorithm, of which numerous examples have been described in the literature. B. Hofmann-Wellenhof et al., Global Positioning System: Theory and Practice, 5th Edition, 1001 (hereinafter "Hofmann-Wellenhof [1001]"), gives comprehensive descriptions of different methods of differential GNSS position computation, ranging in accuracies from one meter to a few centimeters. The single-baseline differential GNSS position algorithm typically computes differences between the handheld wireless device 201 and reference receiver observables to cancel atmospheric delay errors and other common mode errors such as orbital and satellite clock errors. The VRS position is usually specified to be close to or the same as the roving receiver's estimated position so that the actual atmospheric errors in the handheld wireless device 201 GNSS receiver 141's observables approximately cancel the estimated atmospheric errors in the VRS observables in the handheld wireless device 201's reference observables differences.

The VRS corrections generator computes the synthetic observables at each sampling epoch (typically once per second) from the geometric ranges between the VRS position and the M satellite positions as computed using well-known algorithms such as those given in IS-GPS-200G interface specification tilted "Naystar GPS Space Segment/Navigation User Interfaces," and dated 5 Sep. 2012. It estimates the typical pseudorange and phase errors comprising receiver clock error, satellite clock errors, ionospheric and tropospheric signal delay errors and noise, applicable at the VRS position from the N sets of M observables generated by the reference receivers, and adds these to the synthetic observables.

A network RTK system operated in real time requires each GNSS reference receiver to transmit its observables to a network server computer that computes and transmits the corrections and other relevant data to the GNSS handheld wireless device 201's GNSS receiver 141. The GNSS reference receivers, plus hardware to assemble and broadcast observables, are typically designed for this purpose and are installed specifically for the purpose of implementing the network. Consequently, those receivers are called dedicated (network) reference receivers.

An example of a VRS network is designed and manufactured by Trimble Navigation Limited, of Sunnyvale, Calif. The VRS network as delivered by Trimble includes a number of dedicated reference stations, a VRS server, multiple server-reference receiver bi-directional communication channels, and multiple server-cellular-device-bi-directional data communication channels. Each server-cellular device bi-directional communication channel serves one handheld wireless device 201. The reference stations provide their observables to the VRS server via the server-reference receiver bi-directional communication channels. These channels can be implemented by a public network such as the Internet. The bi-directional server-cellular-device communication channels can be radio modems or cellular telephone links, depending on the location of the server with respect to the handheld wireless device 201.

The VRS server combines the observables from the dedicated reference receivers to compute a set of synthetic observables at the VRS position and broadcasts these plus the VRS position in a standard differential GNSS (DGNSS) message format, such as one of the RTCM (Radio Technical Commission for Maritime Services) formats, an RTCA (Radio Technical Commission for Aeronautics) format or a proprietary format such as the CMR (Compact Measurement Report) or CMR+ format which are messaging system communication formats employed by Trimble Navigation Limited. Descriptions for numerous of such formats are widely available. For example, RTCM Standard 10403.1 for DGNSS Services—Version 3, published Oct. 26, 2006 (and Amendment 2 to the same, published Aug. 31, 2007) is available from the Radio Technical Commission for Maritime Services, 1800 N. Kent St., Suite 1060, Arlington, Va. 22209. The synthetic observables are the observables that a reference receiver located at the VRS position would measure. The VRS position is selected to be close to the handheld wireless device 201's estimated position so that the handheld wireless device 201's VRS separation is less than a maximum separation considered acceptable for the application. Consequently, the handheld wireless device 201 GNSS receiver 141 must periodically transmit its approximate position to the VRS server. The main reason for this particular implementation of a real-time network RTK system is compatibility with RTK survey GNSS receivers that are designed to operate with a single reference receiver.

Descriptions of the VRS technique are provided in U.S. Pat. No. 6,324,473 of (hereinafter "Eschenbach") (see particularly col. 7, line 21 et seq.) and U.S. Patent application publication no. 2005/0064878, of B. O'Meagher (hereinafter "O'Meagher"), which are assigned to Trimble Navigation Limited; and in H. Landau et al., Virtual Reference Stations versus Broadcast Solutions in Network RTK, GNSS 2003 Proceedings, Graz, Austria (2003).

The term "VRS", as used henceforth in this document, is used as shorthand to refer to any system or technique which has the characteristics and functionality of VRS described or referenced herein and is not necessarily limited to a system from Trimble Navigation Ltd. Hence, the term "VRS" is used in this document merely to facilitate description and is used without derogation to any trademark rights of Trimble Navigation Ltd. or any subsidiary thereof or other related entity.

Precise Positioning Point (PPP)

Descriptions of a Precise Point Positioning (PPP) technique are provided in U.S. Patent application publication 20110187590, of Leandro, which is assigned to Trimble Navigation Limited. Trimble Navigation Limited has commercialized a version of PPP corrections which it calls RTX™. PPP corrections can be any collection of data that provides corrections from a satellite in space, clock errors, ionosphere or troposphere, or a combination thereof. According to one embodiment, PPP corrections can be used in instead of WAAS or RTX™.

The term Precise Point Positioning (PPP), as used henceforth in this document, is used as shorthand to refer to any system or technique which has the characteristics and functionality of PPP described or referenced herein and is not necessarily limited to a system from Trimble Navigation Ltd. Hence, the term "PPP" is used in this document merely to facilitate description and is used without derogation to any trademark rights of Trimble Navigation Ltd. or any subsidiary thereof or other related entity. Techniques for generating PPP corrections are well known in the art. In general, a PPP system utilizes a network (which may be global) of GNSS reference receivers tracking navigation satellites such as GPS and GLONASS satellites and feeding data back to a centralized location for processing. At the centralized location, the precise orbits and precise clocks of all of the tracked navigation satellites are generated and updated in real time. A correction stream is produced by the central location; the correction stream contains the orbit and clock information. This correction stream is broadcast or otherwise provided to GNSS receivers, such as a GNSS receiver 141, in the field (conventionally by satellite service or cellular link). Corrections processors in the GNSS receivers utilize the corrections to produce centimeter level positions after a short convergence time (e.g., less than 30 minutes). A main difference between PPP and VRS is that PPP networks of reference receivers are typically global while VRS networks may be regional or localized with shorter spacing between the reference stations in a VRS network.

Figure 2A:
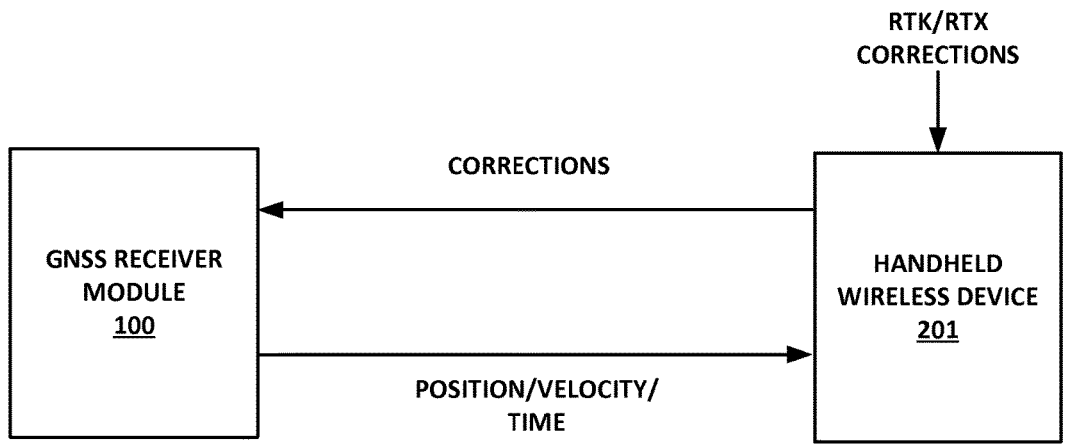
FIGS. 2A and 2B are diagrams showing the exchange of data between an external GNSS receiver module and a handheld wireless device in accordance with various embodiments.
Figure 2B:
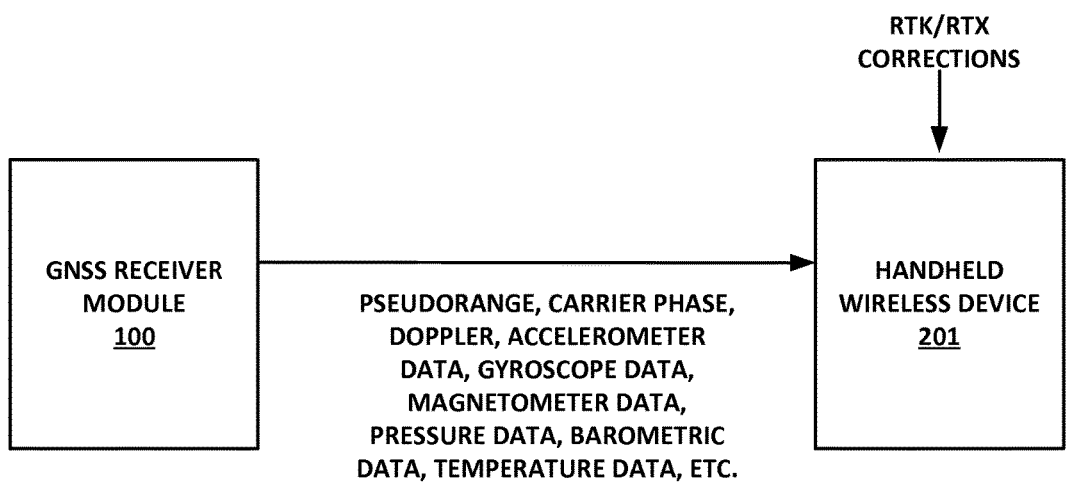

FIGS. 2A and 2B are diagrams showing the exchange of data between an external GNSS receiver module 100 used as a sensing device and a handheld wireless device 201 proximate to external GNSS receiver module 100 in accordance with various embodiments. In accordance with various embodiments, external GNSS receiver module 100 can be coupled, via data connector 107, with handheld wireless device 201. In accordance with another embodiment, external GNSS receiver module 100 can be coupled with handheld wireless device 201 via a wireless communication link (e.g., using wireless communication device(s) 106. In accordance with at least one embodiment, external GNSS receiver module 100 is configured as a pole mounted sensing device used in the collection of geographical data. In the example of FIG. 2A, handheld wireless device 201 receives RTK/RTX corrections as described above (e.g., via a cellular network 122 or Wi-Fi network 124). These RTK/RTX corrections are then sent to a proximate external GNSS receiver module 100 (e.g., via a wired connection using data connector 107, or via a wireless data connection using wireless communication device(s) 106. External GNSS receiver module 100 then uses the RTK/RTX corrections to refine the position fixes it determines locally. However, it is noted that whether GNSS receiver 102 outputs a position fix, or simply outputs raw GNSS observables, external GNSS receiver module 100 is configured to store raw GNSS observables in raw GNSS observables file 111. In the example of FIG. 2A, after external GNSS receiver module 100 has determined its location, location data such as the position (e.g., a position fix), velocity, and, time (PVT) are sent from external GNSS receiver module 100 to handheld wireless device 201 proximate to external GNSS receiver module 100. In accordance with various embodiments, the PVT data can be stored upon handheld wireless device 201, or sent (e.g., via a wireless communication link) to a computer system located apart from external GNSS receiver module 100 and/or handheld wireless device 201. In accordance with at least one embodiment, when handheld wireless device 201 receives the PVT data from external GNSS receiver module 100, it will generate a signal indicating to a user that a GNSS data collection operation has been performed, logged, or noted. In accordance with various embodiments, a visual signal, an audible signal, or a combination of both may be generated to indicate to a user that a GNSS data collection operation has been performed, logged, or noted. A visual signal may include, but is not limited to, a flashing light, or a displayed message on a display device. An audible signal may simply be a tone, or series of tones, which are differentiated to provide an audible signal indicating which GNSS data collection operation has been performed, logged, or noted. In another embodiment, a voice message is generated by handheld wireless device 201 telling the user which GNSS data collection operation has been performed, noted, or logged. It is noted that external GNSS receiver module 100 can also use SBAS signals to refine the precision of one or more position fixes as well.

In the embodiment shown in FIG. 2B, handheld wireless device receives RTK/RTX corrections as described above. However, in the embodiment of FIG. 2B, no corrections are sent from handheld wireless device 201 to external GNSS receiver module 100. Instead, as well as saving the indication(s) of motion of external GNSS receiver module 100 in context file 110 and the concurrently collected raw GNSS observables in raw GNSS observables file 111, data is sent from external GNSS receiver module 100 to handheld wireless device 201 which is proximate to external GNSS receiver module 100. In the example of FIG. 2B, the data sent from external GNSS receiver module 100 to handheld wireless device 201 comprises pseudorange data, carrier phase data, Doppler shift data, accelerometer data, gyroscope data, magnetometer data, barometric pressure data, temperature data, etc. It is noted that not all of the data listed above may be sent with each detected event of motion detected by external GNSS receiver module 100. As described above, this data is time stamped so that an indication of motion can be properly matched with the raw GNSS observables collected at that time. In the example of FIG. 2B, GNSS processing of the raw GNSS observables, as well as sensor fusion operations described above, are performed using processor 143 of handheld wireless device 201. As a result, handheld wireless device 201 can compare the indication of the motion of external GNSS receiver module 100 and compare this indication with operations defined in the version of gesture library 113 stored locally on memory 144. Additionally, handheld wireless device 201 can apply the received RTK/RTX, or other received GNSS correction data, to the raw GNSS observables received from external GNSS receiver module 100. In accordance with various embodiments the refined PVT data, as well as corresponding GNSS data collection operations, can be stored in memory 144.

Figure 3:
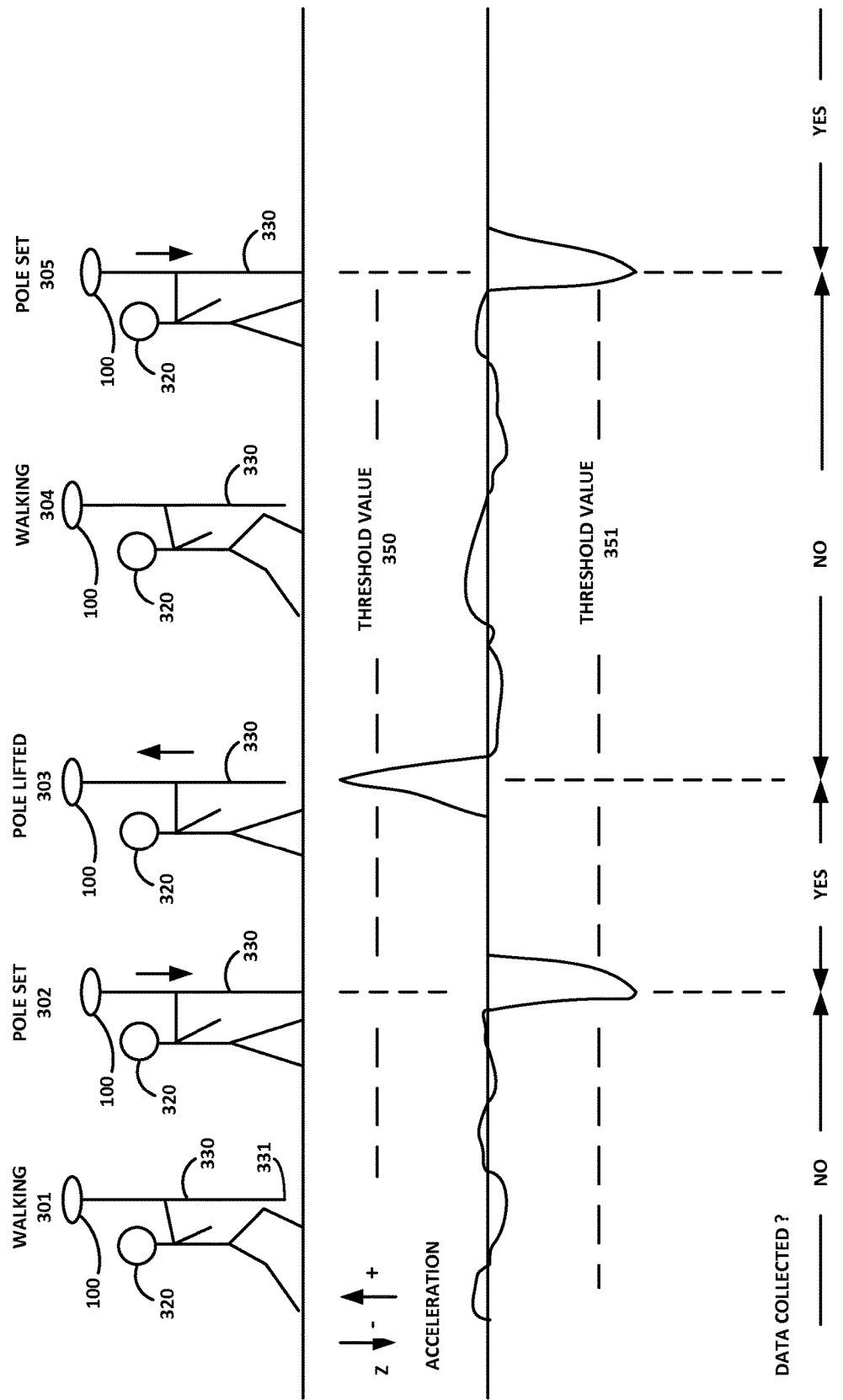
FIG. 3 shows a use scenario of an external GNSS receiver module in accordance with various embodiments.

FIG. 3 shows a use scenario of an external GNSS receiver module in accordance with various embodiments. In operation 301 of FIG. 3, a user 320 is walking with a pole-mounted external GNSS receiver module 100 as described above. Below is shown accelerometer data collected using MEMS sensor suite 105. As shown in FIG. 3, as a user 320 is walking, some acceleration is indicated by MEMS sensor suite 105. At operation 302 of FIG. 3, a user 320 sets the end of the pole 330 down on a particular point at which the user 320 desires to collect position information. As a result of the user 320 setting the pole 330 down at this particular point, the data from one of the accelerometers of MEMS sensor suite 105 indicates a negative acceleration in the Z-axis. After the user 320 has set the pole 330 in position, the acceleration data in the Z-axis remains stable at G. It is noted that in the embodiment shown in FIG. 3, the negative acceleration in the Z-axis exceeds a pre-defined threshold value 351 which is recognized as an intentional user operation for controlling the collection of GNSS data. This indication of negative acceleration in the Z-axis is compared in gesture library 113 with defined gestures and their corresponding GNSS data collection operations. In the example of FIG. 3, gesture library correlates the negative acceleration in the Z-axis with performing a data collection operation of GNSS data from GNSS receiver 102. In other words, the GNSS data is time stamped at the time that it is detected that negative acceleration in the Z-axis has exceeded threshold value 351. In accordance with various embodiments, when an adequate amount of time has elapsed for a position determination to be made with a pre-defined level of precision, handheld wireless device 201 can generate an audible signal, and/or visual signal, indicating to user 320 that a valid data collection operation has been performed, logged, or noted. Alternatively, the user 320 can simply set the end of the pole 330 down on the particular point at which the user 320 desires to collect position information and then continue moving. In accordance with at least one embodiment, a pressure sensor 331 is located at the bottom of pole 330 and can be used to detect contact with the ground. In at least one embodiment, pressure sensor 331 provides additional information in detecting vertical displacement gestures. For example, a complementary filter (not shown) can be used to blend pressure data from pressure sensor 331 with Z-axis data from MEMS sensor suite 105 to provide a more definitive indication of user gestures. Thus, a vertical displacement of pole 330 may have a minimum threshold of 0.5 meters before it is recognized as an intentional user gesture. Alternatively, a minimum threshold of negative 2 g's of vertical acceleration in the Z-axis must be detected before it is recognized as an intentional user gesture. In accordance with at least one embodiment, the combination of vertical displacement and vertical acceleration is recognized as an intentional user gesture. Furthermore, various embodiments are not intended to be limited to the gestures and movements described herein. Rather, the descriptions of gestures and movements described herein are intended as examples descriptive of various embodiments. For example, tilting of pole 330 can be detected and interpreted as an intentional user gesture as well. As shown in operation 303, the pole 330 upon which external GNSS receiver module 100 is mounted has been lifted and a corresponding positive acceleration in the Z-axis is indicated. Again, the positive acceleration in the Z-axis exceeds the pre-defined threshold value 350 which is interpreted as a positive indication of a user gesture. This user gesture again defines, in gesture library 113, that a data collection operation of GNSS data from GNSS receiver 102 is to be performed. In the case of operation 303, the user defined operation is the cessation of data collection using GNSS receiver 102. In other words, although GNSS signals are received by GNSS receiver 102, the data derived from these signals, as well as any corresponding raw GNSS observables, is discarded. In operation 304, the user is again walking with the pole-mounted external GNSS receiver module 100. As shown in FIG. 3, due to the user 320's motion of external GNSS receiver module 100, acceleration in the Z-axis is indicated. However, as this acceleration does not exceed the pre-defined threshold values 350 and 351, it does not trigger storing the acceleration data in context file 110, or interpreting the acceleration as a user-defined gesture. In operation 305, the pole 330 upon which external GNSS receiver module 100 is mounted is again set at a point at which the user 320 desired to collect GNSS data. Again, the negative acceleration of external GNSS receiver module 100 in the Z-axis is shown to exceed the pre-defined threshold value 351. Again, this triggers time stamping and storing the acceleration data in context file 110 and the raw GNSS observables collected at the same time in raw GNSS observables file 111. It is noted that while Figure discusses single discreet motions which are correlated with corresponding operations in the collection of GNSS data, various embodiments are not limited to single discreet motions alone. For example, in accordance with various embodiments, a plurality of discreet motions detected within a defined time interval can be correlated, using gesture library 113, with a defined operation(s) in the collection of GNSS data by GNSS receiver 102.

Figure 4:
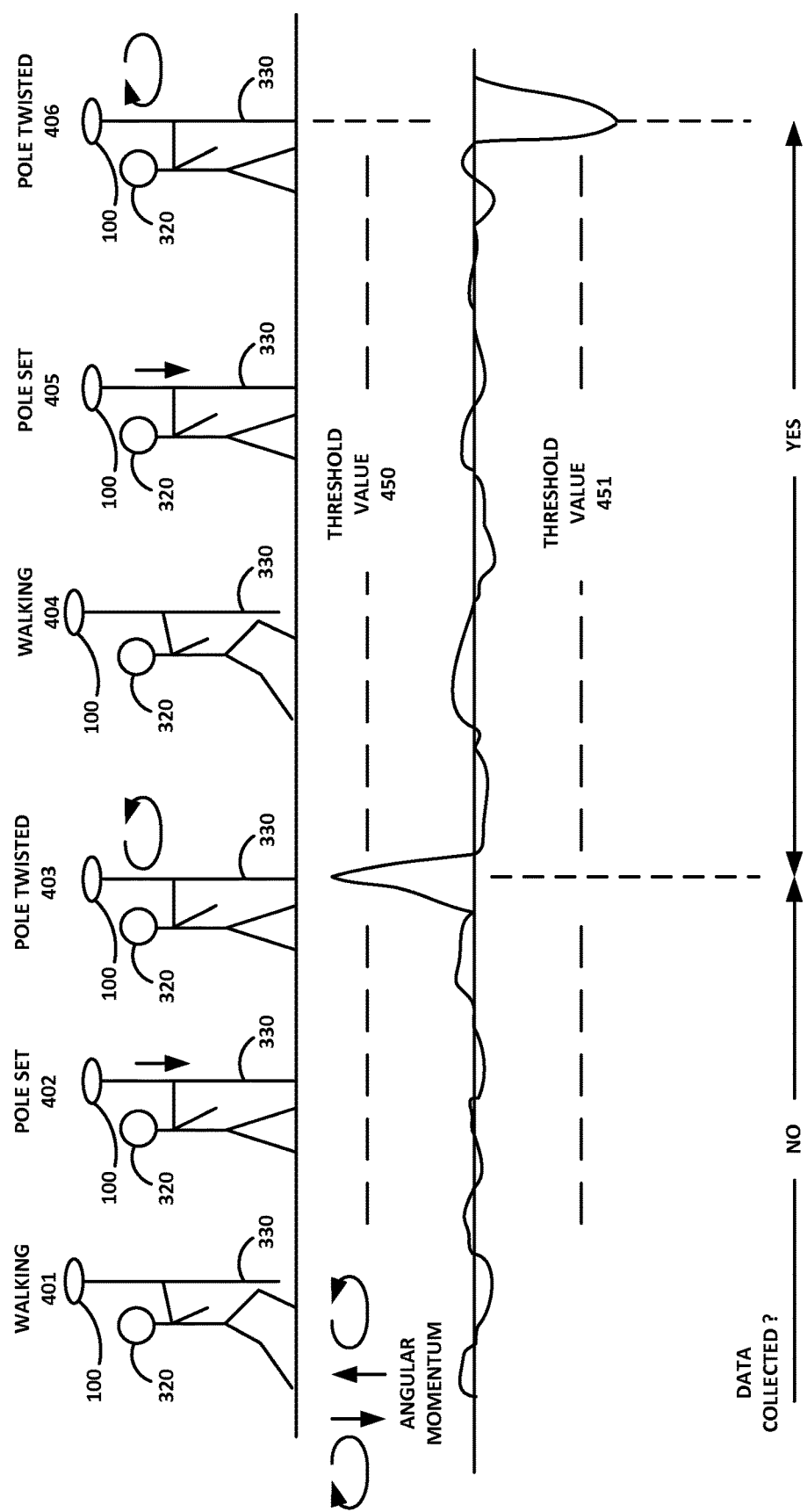
FIG. 4 shows a use scenario of an external GNSS receiver module in accordance with various embodiments.

FIG. 4 shows a use scenario of an external GNSS receiver module in accordance with various embodiments. FIG. 4 shows how a different set of user actions is used to control GNSS data collection operations in accordance with various embodiments. In operation 401, a user 320 is again walking with a pole-mounted external GNSS receiver module 100. As shown in FIG. 4, gyroscope data from MEMS sensor suite 105 does not indicate sufficient angular momentum in the Z-axis to indicate a user defined gesture. In operation 402 the user 320 sets the end of the pole 330 at a location at which GNSS position data is desired. In the example of FIG. 4, the negative acceleration of external GNSS receiver module 100 in the Z-axis is defined as a gesture correlated with a GNSS data collection operation. In operation 403, the user 320 twists pole-mounted external GNSS receiver module 100 in a counter-clockwise direction. As shown in FIG. 4, this twisting causes an angular acceleration around the Z-axis which exceeds a pre-defined threshold value 451 which is interpreted as a positive indication of a user gesture. Again, this initiates the time stamping and storing of the user gesture (e.g., the angular acceleration in the Z-axis exceeding the threshold value 451) in context file 110. This also triggers the time stamping and storing the raw GNSS observables collected at the same time in raw GNSS observables file 111. In the example of FIG. 4, this user gesture is correlated in gesture library 113 with the GNSS data operation of initiating the collection of GNSS data. In operation 404 of FIG. 4, the user 320 has picked up the pole 330 upon which external GNSS receiver module 100 is mounted. In this particular example, the user 320 is collecting linear GNSS data, such as walking a route and continuously collecting GNSS data points along that route. In operation 405, the user 320 again sets down the pole 330 upon which external GNSS receiver module 100 is mounted. Again, it is noted that while the user 320 is walking with pole-mounted external GNSS receiver module 100, the angular acceleration data around the Z-axis does not exceed either of the pre-defined threshold values 450 and 451 and therefore does not trigger storing an event in context file 110. In operation 406, the user 320 twists pole-mounted external GNSS receiver module 100 in a clockwise direction. As shown in FIG. 4, this causes an angular momentum which is detected by MEMS sensor suite 105. In the example of FIG. 4, because this exceeds the pre-defined threshold value 450 it is interpreted as an intentional user gesture. As a result, it is time stamped and recorded/stored in context file 110. As described above, the user 320 was recording linear GNSS data and therefore at least the raw GNSS observables have been recorded from operation 403 to operation 406. However, because external GNSS receiver module 100 has interpreted operation 406 as an intentional user gesture, it is compared with gestures stored in gesture library 113 and correlated with the GNSS operation to stop taking GNSS measurements. As a result, raw GNSS observables, or refined GNSS position fixes, will not be processed or stored. It is again noted that, in accordance with various embodiments, a plurality of discreet motions detected within a defined time interval can be correlated, using gesture library 113, with a defined operation(s) in the collection of GNSS data by GNSS receiver 102 rather than a single indication of motion.

Figure 5:
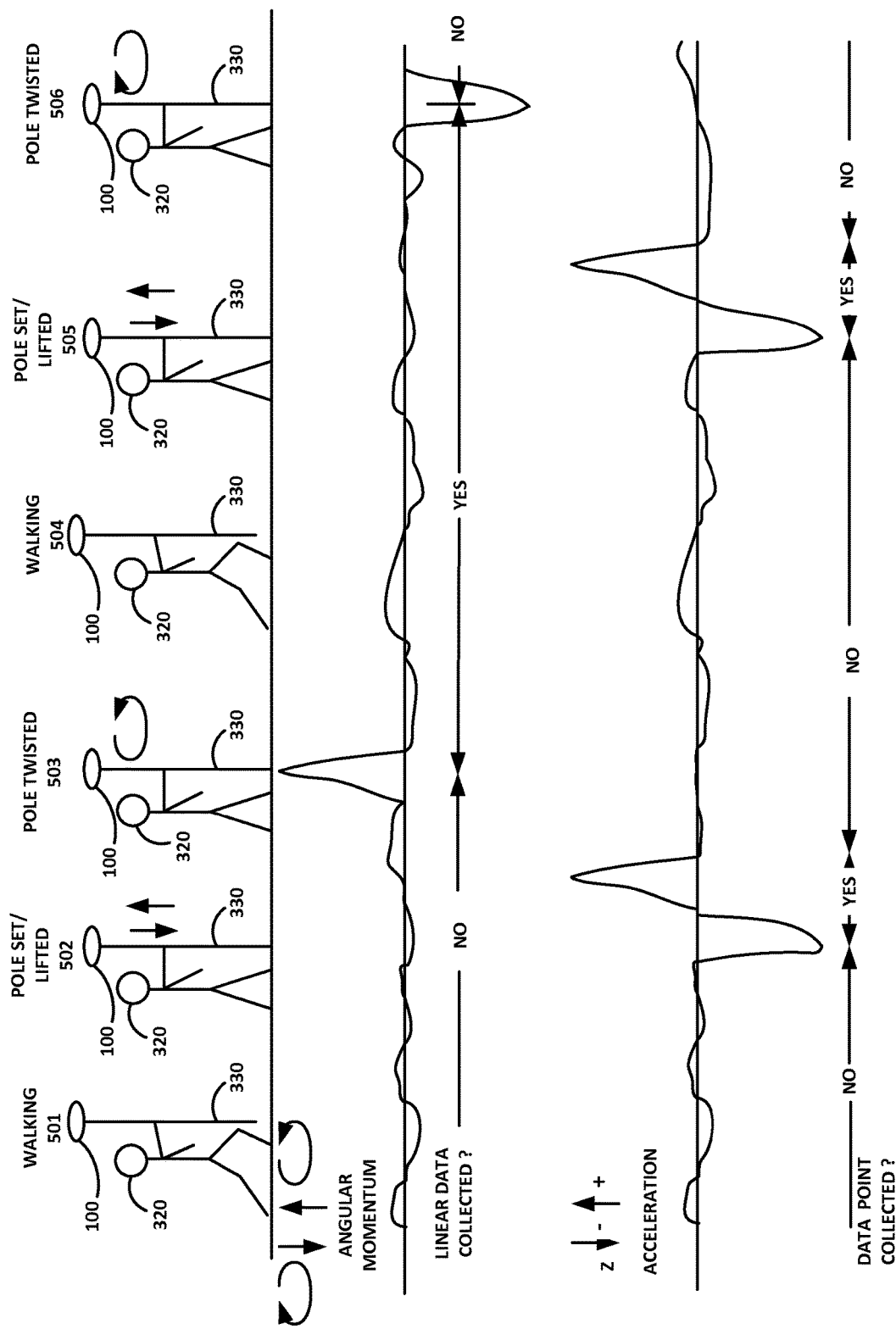
FIG. 5 shows a use scenario of an external GNSS receiver module in accordance with various embodiments.

FIG. 5 shows a use scenario of an external GNSS receiver module in accordance with various embodiments. FIG. 5 shows a situation in which both linear and point data are collected at the same time. In operation 501, user 320 is walking with pole-mounted external GNSS receiver module 100. As shown in FIG. 5, as described above the negative and/or positive acceleration of external GNSS receiver module 100 is detected as exceeding pre-defined threshold values (not shown). As shown in operations 502 and 503, the user 320 sets the end of the pole 330 down on a location at which GNSS position data is desired and then picks the pole 330 back up. The corresponding negative and positive acceleration data from MEMS sensor suite indicates the respective negative and positive accelerations of external GNSS receiver module 100 in the Z-axis as described above. As a result of these negative and positive accelerations exceeding the pre-defined threshold values (e.g., 350 and 351 of FIG. 3) these accelerations are recognized as an intentional user gesture. These gestures are again recorded in context file 110 as well as the raw GNSS observables detected by GNSS receiver 102 at those times. Additionally, an indication of the motion of external GNSS receiver module 100 is compared in gesture library 113 with pre-defined GNSS operations to be performed on the GNSS data. As an example, the pre-defined GNSS operations to be performed with respect to the negative and positive accelerations in the Z-axis are respectively correlated with beginning and ending a data collection operation. As an example, this could be used to collect GNSS point data about a particular point of interest.

In operation 503, pole-mounted external GNSS receiver module 100 is twisted in a counter-clockwise direction. This could either be at another location, or at the same location at which operations 501 and 502 were performed. Again, as described above as a result of the counter-clockwise twisting of external GNSS receiver module 100, a negative angular momentum around the Z-axis is detected which exceeds a pre-defined threshold value (e.g., 451 of FIG. 4). Again, when the angular momentum exceeds the pre-defined threshold value, this is recognized as an intentional user gesture. The indication of motion is again time stamped and stored in context file 110 and the raw GNSS observables are time stamped and stored in raw GNSS observables file 111. In the example of FIG. 5, gesture library 113 again correlates the negative angular momentum of external GNSS receiver module 100 with a GNSS operation to begin collecting linear GNSS data. As an example of the linear GNSS data to be collected is will be assumed that the user 320 of external GNSS receiver module 100 is walking along a fence-line and also marking the individual locations of fence posts. In operation 504 the user 320 is walking with pole-mounted external GNSS receiver module 100 and neither the acceleration data nor the angular momentum data exceeds their respective threshold values.

At operation 505, the user 320 again sets and lifts pole mounted external GNSS receiver module 100 at a location at which position data is desired (e.g., at a fence post). The operations described above are again repeated and point data, as opposed to the linear GNSS data previously recorded, is recorded. In accordance with various embodiments, this does not mean that linear GNSS data is not recorded at this point as well, simply that the location at which pole-mounted external GNSS receiver module 100 is set down at that particular point (e.g., a fence post) is also separately recorded as a discreet data point with a corresponding indication of the motion of external GNSS receiver module 100 recorded in context file 110. At operation 506, pole-mounted external GNSS receiver module 100 is twisted in a clockwise manner. Again, this causes a positive angular momentum around the Z-axis which is recognized as an intentional user gesture. This indication of motion is time stamped and stored in context file 110 as well as the raw GNSS observables collected at that same time being time stamped and stored in raw GNSS observables file 111. Additionally, the indication of motion is compared with gestures defined in gesture library 113 and correlated with the operation of cessation of the collection of linear GNSS data. Thus, based upon how gestures are defined in gesture library 113, a variety of operation in the collection of GNSS data can be controlled, sometimes concurrently, based upon the motion of external GNSS receiver module 100.

Figure 6:
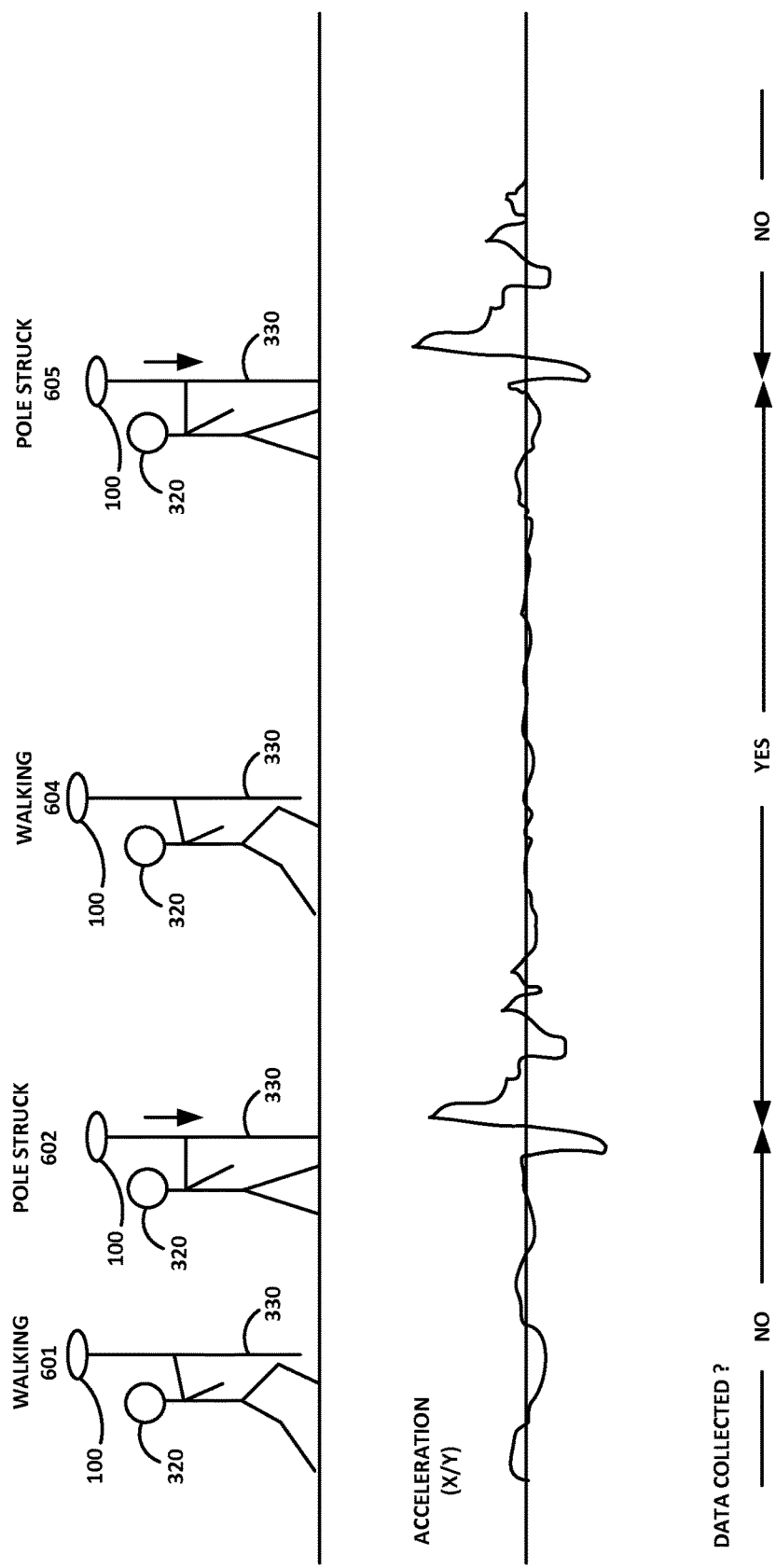
FIG. 6 shows a use scenario of an external GNSS receiver module in accordance with various embodiments.

FIG. 6 shows a use scenario of an external GNSS receiver module in accordance with various embodiments. In the case of FIG. 6, rather than setting/lifting and/or twisting of pole-mounted external GNSS receiver module 100, a user 320 simply strikes the pole 330 upon which external GNSS receiver module 100 is mounted. This causes a vibration, shown as acceleration in any direction, which is detected by MEMS sensor suite 105. Thus, in operations 601 and 604 while the user 320 is walking with pole-mounted external GNSS receiver module 100, the acceleration in any direction does not exceed the pre-defined threshold values (e.g., 350 and 351 of FIG. 3) which is recognized as an intentional user gesture. At operation 602 however, the user 320 has set pole-mounted external GNSS receiver module 100 at a location at which GNSS data is desired and struck the pole 330 upon which external GNSS receiver module 100 is mounted. This causes a vibration, in any direction, which exceeds the pre-defined threshold value(s). It is noted that although FIG. 6 shows the vibration as an aggregation of accelerations of the X, Y, and Z axes, these accelerations could be detected in individual axes as well. Because the acceleration exceeds the pre-defined threshold value(s), it is recognized as an intentional user gesture. Thus, the acceleration(s) is/are time stamped and recorded in context file 110 and the raw GNSS observables are time stamped and stored in raw GNSS observables file 111. Additionally, the indication of motion (e.g., the acceleration(s) exceeding the pre-defined threshold value) is correlated in gesture library 113 with the operation to begin collecting GNSS data. In operation 605, the pole 330 upon which external GNSS receiver module 100 is mounted is again set into position and struck. Again, this causes MEMS sensor suite 105 to detect the indication of motion (e.g., the acceleration(s)) which is recognized as an intentional user gesture. The indication of motion of external GNSS receiver module 100 is again time stamped and stored in context file 110 and the raw GNSS observables collected at the same time are time stamped and stored in raw GNSS observables file 111. As an example, in the case of FIG. 6, the first striking of the pole 330 upon which external GNSS receiver module 100 is mounted may be correlated in gesture library 113 with the operation of beginning to collect GNSS data while the second striking of the pole 330 is correlated with the operation to stop collecting GNSS data. As a result, raw GNSS observables at the least are collected, time stamped, and stored in raw GNSS observables file 111 during the period between operation 602 and 605. It is noted that while not discussed in FIGS. 3, 4, 5, and 6, further processing of the raw GNSS observables may be performed as discussed above either by external GNSS receiver module 100, or handheld wireless device 201.

Figure 7:
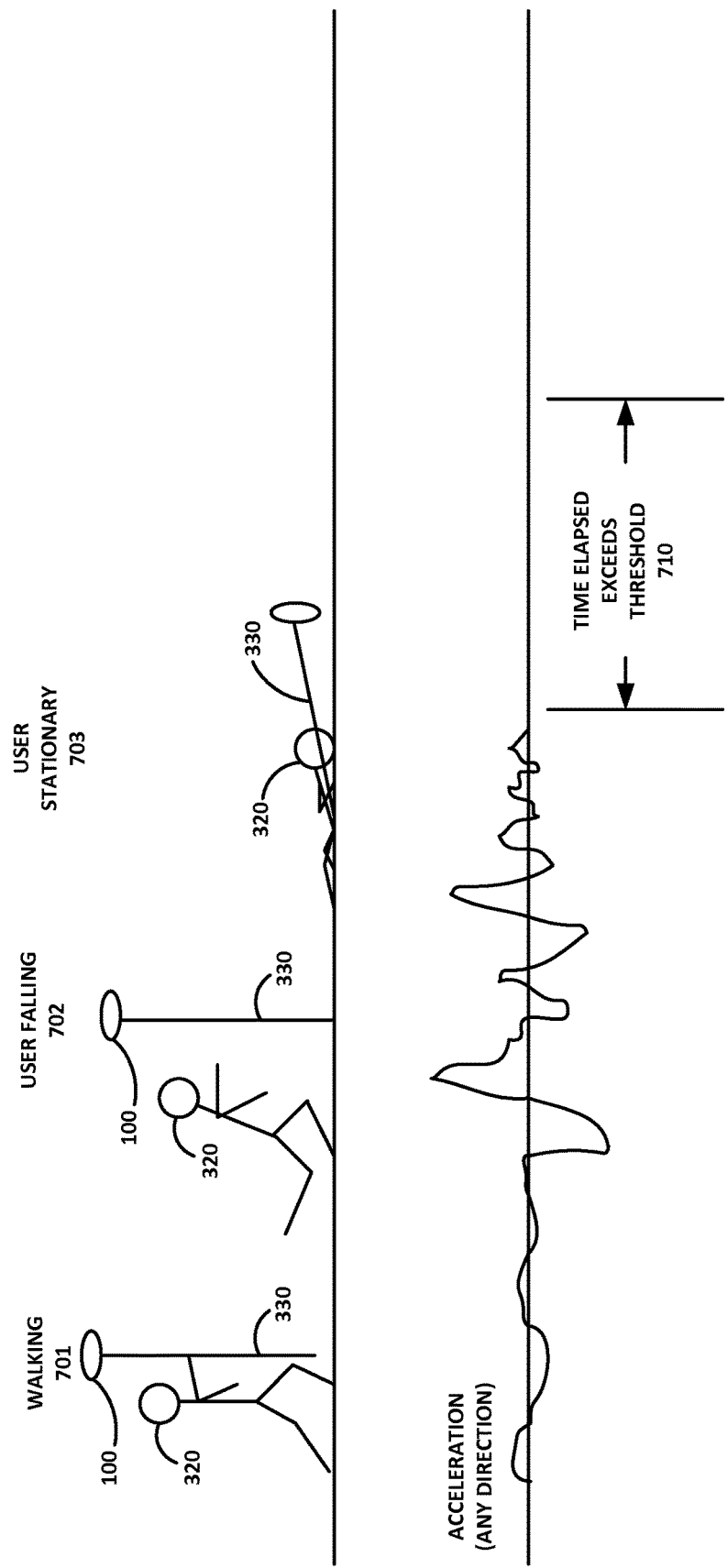
FIG. 7 shows a use scenario of an external GNSS receiver module in accordance with various embodiments.

FIG. 7 shows a use scenario of an external GNSS receiver module in accordance with various embodiments. In accordance with various embodiments, certain user actions, or the lack of certain user actions may indicate that the user has had an accident, or is otherwise in need of assistance. For example, in operation 701 a user 320 is walking with pole-mounted external GNSS receiver module 100. At operation 702, the user 320 falls. As shown in FIG. 7, the acceleration data from MEMS sensor suite 105 indicates a large amount of acceleration data, probably in a random manner, which exceeds a pre-defined threshold value. However, after the user 320 has fallen and remains motionless for a pre-defined time interval, this is interpreted as an indication that the user 320 requires assistance. In other words, gesture library correlates the indication of motion (e.g., acceleration data, as well as gyroscope and/or magnetometer data), followed by detecting an absence of an indication of motion for a period which exceeds a pre-defined time threshold, with triggering an emergency alert. As a result, handheld wireless device 201 will initiate contacting emergency responders using, for example, cellular transceiver 145 as well as provide data from GNSS receiver 102 and/or 141 which will facilitate finding the user 320 by emergency services. In accordance with various embodiments, gesture library 113 will store an absence of the indication of motion for a period of time which exceeds a pre-defined time parameter which is correlated with initiating the operation to contact an emergency responder and to send GNSS data which describes the location at which external GNSS receiver module 100 and/or handheld wireless device 201 is located. In this situation, gesture library 113 may correlate other actions with this absence of the indication of motion such as generating an audible or visual signal/warning indicating to the operator that emergency services will be contacted unless the user 320 takes corrective measures. This prevents contacting the emergency responded in instances in which the user 320 simply is not moving or operating external GNSS receiver module 100 to collect data.

FIG. 8 is a flowchart of a method 800 for contextual inference of user activity in accordance with various embodiments. In operation 801, an indication is received from at least one motion sensor of the motion of a pole mounted sensing device (e.g., external GNSS receiver module 100) comprising at least one motion sensor and a GNSS receiver configured to at least generate raw GNSS observables. As discussed above, a variety of motion sensors comprising MEMS sensor suite are configured to detect and report the motion state of external GNSS receiver module 100. According to various embodiments, MEMS sensor suite comprises a 3-axis gyroscope, a 3-axis accelerometer, and a 3-axis magnetometer and is configured to provide data describing the alignment of external GNSS receiver module 100 with respect to the gravitational pull of the Earth. Furthermore, external GNSS receiver module 100 comprises a GNSS receiver configured to at least generate raw GNSS observables. However, in accordance with at least one embodiment, the GNSS receiver is further configured to generate position, velocity, and time resolutions of received GNSS signals including the application of GNSS corrections to received signals to further refine the precision of determining a position fix.

In operation 802, the indication of the motion of the pole mounted sensing device is correlated with an operation defined in a gesture library regarding GNSS data collected by the GNSS receiver at the time the indication of the motion is detected. In accordance with various embodiments, once the motion has been recognized as an intentional user gesture, the indication of the motion is correlated in gesture library 113 with an operation to be performed with GNSS data collected by the GNSS receiver of external GNSS receiver module 100. As discussed above, an intentional user gesture is defined as one or more movements of external GNSS receiver module 100 which are within pre-defined parameters (e.g., direction of movement, tilt, impact, twisting, displacement, time parameters, or a combination thereof).

In operation 803, the indication is stored and the GNSS data is stored. According to various embodiments, the indication of motion is stored in a context file of external GNSS receiver module 100 and the GNSS data is stored in a raw GNSS observables file of external GNSS receiver module 100. It is noted that in accordance with various embodiments the indication of motion comprises an indication of motion of at least one, if not a plurality, of the sensors comprising MEMS sensor suite 105.

Figure 9:
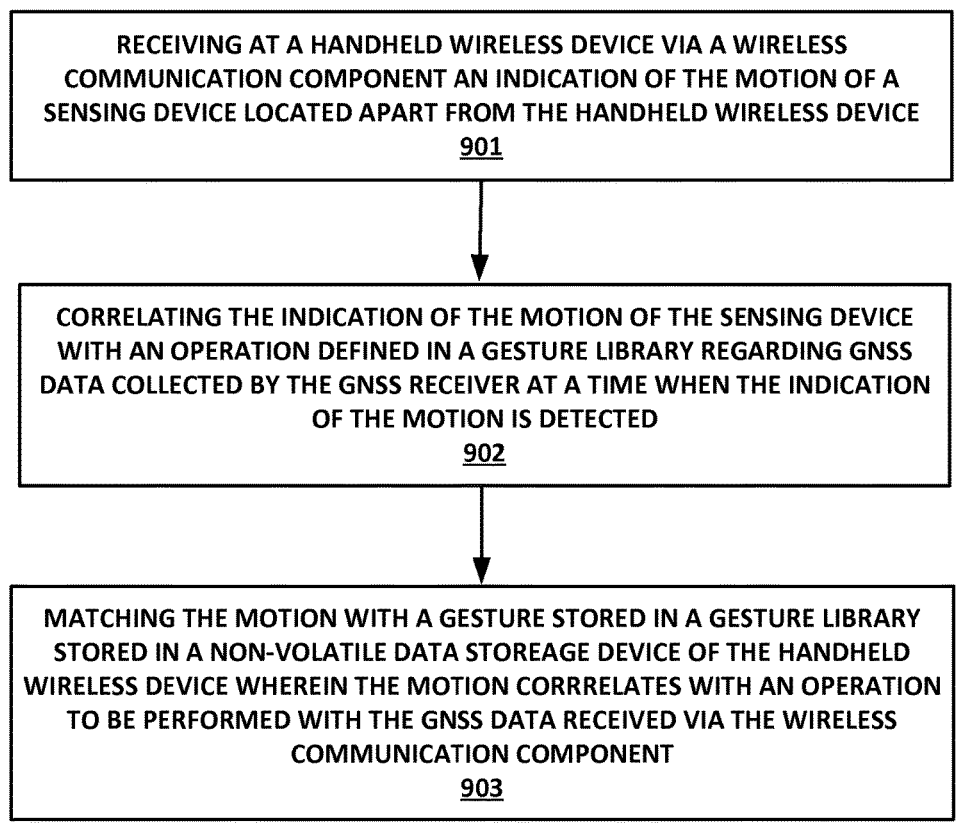
FIG. 9 is a flowchart of a method for contextual inference of user activity in accordance with various embodiments.

FIG. 9 is a flowchart of a method 900 for contextual inference of user activity in accordance with various embodiments. In operation 901, an indication of the motion of a sensing device (e.g., external GNSS receiver module 100) located apart from a handheld wireless device is received at the handheld wireless device via a wireless communication component. As described above, in accordance with various embodiments, external GNSS receiver module 100 can be communicatively coupled with a handheld wireless device such as a cellular telephone. In accordance with various embodiments, the indication of motion detected by MEMS sensor suite 105 can be sent from external GNSS receiver module 100 to handheld wireless device 201 via a wireless or wired data connection (e.g., using wireless communication component(s) 106 or data connector 107). It is noted that in accordance with various embodiments the indication of motion comprises an indication of motion of at least one, if not a plurality, of the sensors comprising MEMS sensor suite 105. In accordance with various embodiments, the handheld wireless device comprises a cellular telephone. In accordance with various embodiments, handheld wireless device 201 can generate an audible and/or visual signal indicating various operations or operating parameters such as the receipt of the indication of motion of external GNSS receiver module 100, the receipt of GNSS data from external GNSS receiver module 100, or to indicate a particular operation which is, or will be, performed with the GNSS data at the time the motion was detected. In accordance with various embodiments, the audible signal may be a tone, or voice message. Furthermore, handheld wireless device 201 can send a signal to external GNSS receiver module 100 which indicates to processor 103 that the data sent from external GNSS receiver module 100 was received by handheld wireless device 201.

In operation 902, GNSS data recorded at the same time the indication of the motion of the sensing device (e.g., external GNSS receiver module 100) was detected by a GNSS receiver configured to at least generate raw GNSS observables is received at the handheld wireless device via the wireless communication component. In accordance with various embodiments, the GNSS data recorded by GNSS receiver 102 of external GNSS receiver module 100 which is recorded at the same time that the indication of motion was detected is also sent from external GNSS receiver module 100 to handheld wireless device 201. Again, the GNSS data can be received by handheld wireless device 201 via a wired or wireless data connection.

In operation 903, the indication of the motion of the sensing device is correlated with an operation defined in a gesture library regarding GNSS data collected by the GNSS receiver at the time the indication of the motion is detected. In accordance with various embodiments, gesture library 113 stored in memory 144 of handheld wireless device 201 is used to correlate the indication of motion of external GNSS receiver module 100 with an operation to be performed with the GNSS data received via the wireless communication component (e.g., Wi-Fi transceiver 148 of FIG. 1B).

FIG. 10 is a flowchart of a method 1000 for contextual inference of user activity in accordance with various embodiments. In operation 1001, a gesture library is stored in a non-transitory data storage device wherein an indication of the motion of a motion sensor (e.g., MEMS sensor suite 105 of FIG. 1A) is correlated with a defined operation in the collection of GNSS data by a GNSS receiver configured to at least generate raw GNSS observables. As discussed above, in accordance with various embodiments, a copy of gesture library 113 can be stored in a non-transitory data storage device of handheld wireless device 201 (e.g., memory 144 of FIG. 1B), or external GNSS receiver module 100 (e.g., non-volatile data storage device 112 of FIG. 1A).

In operation 1002, the indication of the motion of at least one motion sensor is received at a processor. In accordance with various embodiments, processor a processor (e.g., 103 of FIG. 1A) of external GNSS receiver module 100, or of handheld wireless device 201 (e.g., 143 of FIG. 1B), receives an indication of motion which originates from MEMS sensor suite 105 of external GNSS receiver module 100. It is noted that in accordance with various embodiments the indication of motion comprises an indication of motion of at least one, if not a plurality, of the sensors comprising MEMS sensor suite 105.

In operation 1003, the gesture library is accessed by the processor. In accordance with various embodiments, when the motion is recognized as an intentional user gesture, the processor accesses gesture library 113 to determine what operation the user intends to initiate with relation to the collection of GNSS data.

In operation 1004, the processor determines that the indication of the motion is defined in the gesture library. In accordance with various embodiments, the processor will search gesture library 113 to match the received indication of motion with motion(s) profiles stored in gesture library 113. Furthermore in at least one embodiment, the absence of the indication of motion for a period of time which exceeds a pre-defined time parameter may be interpreted as an indication of a problem such as an accident or injury of an operator of external GNSS receiver module 100. In accordance with various embodiments, in response to an absence of the indication of motion as described above, the processor will initiate an operation contact an emergency responder. In accordance with various embodiments, gesture library 113 will store an absence of the indication of motion for a period of time which exceeds a pre-defined time parameter which is correlated with initiating the operation to contact an emergency responder and to send GNSS data which describes the location at which external GNSS receiver module 100 and/or handheld wireless device 201 is located.

In operation 1005, the processor performs a defined operation in the collection of GNSS data in response to the determining by the processor that the indication of the motion is defined in the gesture library. In accordance with various embodiments, when the processor determines that the received indication of motion matches one of the motion profiles stored in gesture library 113, it will initiate the operation which is correlated with that particular motion profile. It is noted that the operations 1001-1005 can be performed either by external GNSS receiver module 100, or handheld wireless device 201. Furthermore, external GNSS receiver module 100 and handheld wireless device 201 are configured to use received GNSS corrections data (e.g., SBAS, RTK/RTX, or other corrections sources) to refine the precision of a given position fix. Furthermore, as context file 110 and raw GNSS observables file 111 are stored on removable data storage device 109, these corrections can be applied later during post-processing of the raw GNSS observables.

Example GNSS Receiver

Figure 11:
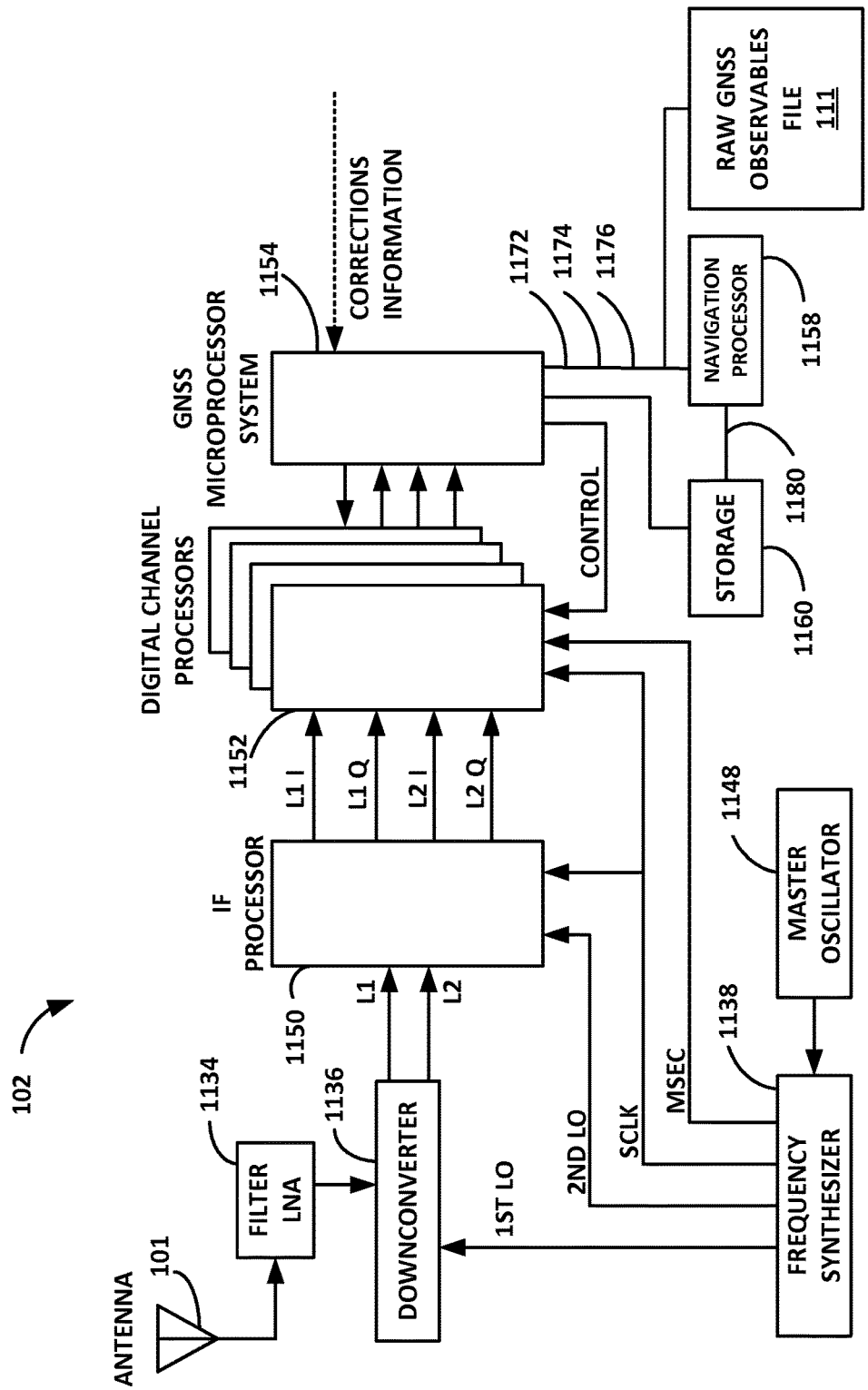
FIG. 11 is a block diagram of an example GNSS receiver used in accordance with various embodiments.

With reference now to FIG. 11, a block diagram is shown of an embodiment of an example GNSS receiver 102 which may be used in accordance with various embodiments described herein. In particular, FIG. 11 illustrates a block diagram of a GNSS receiver in the form of a general purpose GPS receiver capable of demodulation of the L1 and/or L2 signal(s) received from one or more GPS satellites. A more detailed discussion of the function of a receiver such as GPS receiver 102 can be found in U.S. Pat. No. 5,621,416, by Gary R. Lennen, is titled "Optimized processing of signals for enhanced cross-correlation in a satellite positioning system receiver," and includes a GPS receiver very similar to GPS receiver 102 of FIG. 11.

In FIG. 11, received L1 and L2 signals are generated by at least one GPS satellite. Each GPS satellite generates different signal L1 and L2 signals and they are processed by different digital channel processors 1152 which operate in the same way as one another. FIG. 11 shows GPS signals (L1=1575.42 MHz, L2=1127.60 MHz) entering GPS receiver 102 through a dual frequency antenna 101. Master oscillator 1148 provides the reference oscillator which drives all other clocks in the system. Frequency synthesizer 1138 takes the output of master oscillator 1148 and generates important clock and local oscillator frequencies used throughout the system. For example, in one embodiment frequency synthesizer 1138 generates several timing signals such as a 1st (local oscillator) signal LO1 at 1400 MHz, a 2nd local oscillator signal LO2 at 175 MHz, an SCLK (sampling clock) signal at 25 MHz, and a MSEC (millisecond) signal used by the system as a measurement of local reference time. It is noted that in accordance with various embodiments, GNSS receiver 102 can be configured to receive and process signals with different frequencies and modulations that the L1 and L2 signals described above such as the L2C, L5, and E5 signals.

A filter/LNA (Low Noise Amplifier) 1134 performs filtering and low noise amplification of both L1 and L2 signals. The noise figure of GPS receiver 102 is dictated by the performance of the filter/LNA combination. The downconvertor 1136 mixes both L1 and L2 signals in frequency down to approximately 175 MHz and outputs the analog L1 and L2 signals into an IF (intermediate frequency) processor 1150. IF processor 1150 takes the analog L1 and L2 signals at approximately 175 MHz and converts them into digitally sampled L1 and L2 inphase (L1 I and L2 I) and quadrature signals (L1 Q and L2 Q) at carrier frequencies 420 KHz for L1 and at 2.6 MHz for L2 signals respectively.

At least one digital channel processor 1152 inputs the digitally sampled L1 and L2 inphase and quadrature signals. All digital channel processors 1152 are typically are identical by design and typically operate on identical input samples. Each digital channel processor 1152 is designed to digitally track the L1 and L2 signals produced by one satellite by tracking code and carrier signals and to from code and carrier phase measurements in conjunction with the GNSS microprocessor system 1154. One digital channel processor 1152 is capable of tracking one satellite in both L1 and L2 channels. Microprocessor system 1154 is a general purpose computing device which facilitates tracking and measurements processes, providing pseudorange and carrier phase measurements for a determining position fix logic 1158. In one embodiment, microprocessor system 1154 provides signals to control the operation of one or more digital channel processors 1152. According to one embodiment, the GNSS microprocessor system 1154 provides one or more of pseudorange information 1172, Doppler Shift information 1174, and real Carrier Phase Information 1176 to the determining position fix logic 1158. One or more of pseudorange information 1172, Doppler Shift information 1174, and real Carrier Phase Information 1176 can also be obtained from storage 1160. Furthermore, as shown in FIG. 11 pseudorange information 1172, Doppler Shift information 1174, and real Carrier Phase Information 1176 are stored in raw GNSS observables file 111. One or more of the signals 1172, 1174, 1176 can be conveyed to the cellular device's processor, such as processor 109 (FIG. 1A) that is external to the GNSS chipset 170 (FIG. 1A). Determining position fix logic 1158 performs the higher level function of combining measurements in such a way as to produce position, velocity and time information for the differential and surveying functions, for example, in the form of a position fix 1180. Storage 1160 is coupled with determining position fix logic 1158 and microprocessor system 1154. It is appreciated that storage 1160 may comprise a volatile or non-volatile storage such as a RAM or ROM, or some other computer readable memory device or media. In some embodiments, determining position fix logic 1158 performs one or more of the methods of position correction described herein.

In some embodiments, microprocessor 1154 and/or determining position fix logic 1158 receive additional inputs for use in receiving corrections information. According to one embodiment, an example of the corrections information is WAAS corrections. According to one embodiment, examples of corrections information are differential GPS corrections, RTK corrections, signals used by the previously referenced Enge-Talbot method, and wide area augmentation system (WAAS) corrections among others.

Although FIG. 11 depicts a GNSS receiver 102 with navigation signals L1I, L1Q, L2I, L2Q, various embodiments are well suited different combinations of navigational signals. For example, according to one embodiment, the GNSS receiver 102 may only have an L1I navigational signal. According to one embodiment, the GNSS receiver 102 may only have L1I, L1Q and L2I.

Various embodiments are also well suited for future navigational signals. For example, various embodiments are well suited for the navigational signal L2C that is not currently generally available. However, there are plans to make it available for non-military receivers.

CONCLUSION

Example embodiments of the subject matter are thus described. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

Various embodiments have been described in various combinations and illustrations. However, any two or more embodiments or features may be combined. Further, any embodiment or feature may be used separately from any other embodiment or feature. Phrases, such as "an embodiment," "one embodiment," among others, used herein, are not necessarily referring to the same embodiment. Features, structures, or characteristics of any embodiment may be combined in any suitable manner with one or more other features, structures, or characteristics.

What is claimed is:

1. A method for contextual inference of user activity, said method comprising:
   receiving from at least one motion sensor an indication of a motion of a pole-mounted sensing device comprising said at least one motion sensor and a Global Navigation Satellite System (GNSS) receiver configured to at least generate raw GNSS observables;

recognizing said indication of the motion as an intentional gesture of a person carrying the pole-mounted sensing device;

correlating said intentional gesture with an operation defined in a gesture library regarding collection of GNSS data received by said GNSS receiver; and in response to the recognizing said indication of the motion as the intentional gesture and the correlating said intentional gesture with said operation, storing said indication and GNSS data received by said GNSS receiver at a time when said indication of the motion is detected.

2. The method of claim 1 wherein said indication is stored in a context file and said GNSS data is stored in a raw GNSS observables file, said method further comprising:

storing said context file and said raw GNSS observables file in a non-transitory data storage device of said pole-mounted sensing device.

3. The method of claim 1 wherein said pole-mounted sensing device further comprises a wireless communication component, said method further comprising:

sending said indication of the motion of said pole-mounted sensing device and the GNSS data from said pole-mounted sensing device to a handheld wireless device proximate to said pole-mounted sensing device via said wireless communication component.

4. The method of claim 3 wherein said handheld wireless device comprises a cellular telephone.

5. The method of claim 3 wherein said gesture library is stored in said handheld wireless device and wherein said correlating of said intentional gesture with said operation is performed by said handheld wireless device.

6. The method of claim 1 wherein said pole-mounted sensing device further comprises a wireless communication component, said method further comprising:

sending the GNSS data to a handheld wireless device via the wireless communication component; and sending a signal to said handheld wireless device denoting said intentional gesture via said wireless communication component;

wherein said gesture library is stored in said handheld wireless device, and wherein said correlating said intentional gesture with said operation defined in said gesture library and said storing said indication and said GNSS data are performed by said handheld wireless device.

7. The method of claim 6 further comprising:

generating by said handheld wireless device a signal indicating an operating parameter related to the collection of said GNSS data.

8. The method of claim 1 wherein said GNSS receiver is further configured to output a position fix and to receive Satellite-based Augmentation System (SBAS) signals, said method further comprising:

using said SBAS signals to improve a precision of determining a location of a GNSS antenna of said pole-mounted sensing device at the time said indication is received.

9. The method of claim 1 wherein said at least one motion sensor provides data describing alignment of said pole-mounted sensing device with respect to gravitational pull of the Earth.

10. The method of claim 1 further comprising:

detecting an absence of an indication of motion for a period which exceeds a pre-defined time threshold; and correlating said absence of an indication of motion with an operation to initiate contacting emergency responder.

11. The method of claim 1 wherein the indication of the motion of the pole-mounted sensing device relates to at least one of a rate of acceleration and a direction of angular momentum of the sensing device.

12. A method for contextual inference of user activity, said method comprising:

receiving at a handheld wireless device via a wireless communication component an indication of a motion of a sensing device located apart from said handheld wireless device;

receiving at said handheld wireless device, via said wireless communication component, Global Navigation Satellite System (GNSS) data received by a GNSS receiver attached to the sensing device at a time said indication of the motion of said sensing device was detected;

recognizing said indication of the motion as an intentional gesture of a person carrying the sensing device;

correlating said intentional gesture with an operation defined in a gesture library regarding collection of GNSS data received by said GNSS receiver; and in response to the recognizing said indication of the motion as the intentional gesture and said correlating said intentional gesture with said operation, storing said indication and the GNSS data received by said GNSS receiver at the time said indication of the motion of said sensing device was detected.

13. The method of claim 12 wherein said sensing device further comprises a non-transitory data storage device, the method further comprising:

storing a context file comprising said indication of the motion of said sensing device in said non-transitory data storage device; and storing said GNSS data in a raw GNSS observables file in said non-transitory data storage device.

14. The method of claim 12 wherein said handheld wireless device comprises a cellular telephone.

15. The method of claim 12 further comprising:

generating by said handheld wireless device a signal indicating an operating parameter related to collection of said GNSS data.

16. The method of claim 12 wherein said GNSS receiver is further configured to output a position fix and to receive Satellite-based Augmentation System (SBAS) signals, said method further comprising:

using said SBAS signals to improve a precision of determining the location of a GNSS antenna of said sensing device at the time said indication is received.

17. The method of claim 12 wherein the indication of the motion of the sensing device relates to at least one of a rate of acceleration and a direction of angular momentum of the sensing device.

18. A method for contextual inference of user activity, said method comprising:

storing in a non-transitory data storage device a gesture library, the gesture library correlating each of a plurality of gestures with a respective operation regarding collection of Global Navigation Satellite System (GNSS) data received by a GNSS receiver attached to a sensing device;

receiving at a processor an indication of at least one motion of of the sensing device detected by a motion sensor attached to the sensing device;

recognizing by said processor that said indication of the at least one motion as an intentional gesture of a person carrying the sensing device;

accessing said gesture library by said processor;

determining by said processor that said intentional gesture is correlated with a first operation regarding collection of GNSS data defined in said gesture library; and in response to the recognizing said indication of the motion as the intentional gesture and the determining that said intentional gesture is correlated with the first operation, performing by said processor the first operation regarding collection of GNSS data in response to said determining by said processor that said intentional gesture is correlated with the first operation defined in said gesture library.

19. The method of claim 18 wherein said non-transitory data storage device and the processor are disposed in a handheld wireless device, and said sensing device is located apart from the handheld wireless device.

20. The method of claim 19 wherein said sensing device comprises a second non-transitory data storage device, the method further comprising:

storing a context file comprising said indication of the motion of said sensing device in said second non-transitory data storage device; and storing said GNSS data in a raw GNSS observables file in said second non-transitory data storage device.

21. The method of claim 19 wherein said handheld wireless device comprises a cellular telephone.

22. The method of claim 19 further comprising:

generating by the handheld wireless device a signal indicating an operating parameter related to said collection of said GNSS data.

23. The method of claim 18 wherein said GNSS receiver is further configured to output a position fix and to receive Satellite-based Augmentation System (SBAS) signals, said method further comprising:

using said SBAS signals to improve a precision of determining a location of a GNSS antenna of said sensing device at a time said indication is received.

24. The method of claim 18 wherein a plurality of discreet motions of the sensing device detected within a defined time interval is correlated with the intentional gesture.

* * * * *